US012563913B2

(12) United States Patent
Jeon et al.

(10) Patent No.: US 12,563,913 B2
(45) Date of Patent: Feb. 24, 2026

(54) DISPLAY APPARATUS CAPABLE OF DISPLAYING AN IMAGE IN A COMPONENT AREA

(71) Applicant: Samsung Display Co., Ltd., Yongin-si (KR)

(72) Inventors: Yongje Jeon, Yongin-si (KR); Jaeyoung Oh, Yongin-si (KR); Kihong Kim, Yongin-si (KR); Sungwoo Lee, Yongin-si (KR); Kyeongsik Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 436 days.

(21) Appl. No.: 17/449,393

(22) Filed: Sep. 29, 2021

(65) Prior Publication Data

US 2022/0109039 A1 Apr. 7, 2022

(30) Foreign Application Priority Data

Oct. 5, 2020 (KR) ........................ 10-2020-0128271

(51) Int. Cl.
| | |
|---|---|
| *H10K 59/126* | (2023.01) |
| *H10K 59/131* | (2023.01) |
| *H10K 59/65* | (2023.01) |
| *H10K 59/80* | (2023.01) |
| *H10K 59/88* | (2023.01) |

(52) U.S. Cl.
CPC ......... *H10K 59/126* (2023.02); *H10K 59/131* (2023.02); *H10K 59/80516* (2023.02);
(Continued)

(58) Field of Classification Search
CPC .... H10K 59/126; H10K 59/131; H10K 59/88; H10K 50/828; H10K 59/121;
(Continued)

(56) References Cited

U.S. PATENT DOCUMENTS

| | | | |
|---|---|---|---|
| 8,530,910 B2 | 9/2013 | Song et al. | |
| 10,163,984 B1 * | 12/2018 | Ho ..................... | G06V 40/1318 |

(Continued)

FOREIGN PATENT DOCUMENTS

| | | |
|---|---|---|
| CN | 110189639 A | 8/2019 |
| CN | 110473898 A | 11/2019 |

(Continued)

OTHER PUBLICATIONS www.onlinemetals.com/en/melting-points (Year: 2022).*

*Primary Examiner* — Chad M Dicke
*Assistant Examiner* — Jeremy Daniel Watts
(74) *Attorney, Agent, or Firm* — Womble Bond Dickinson (US) LLP

(57) ABSTRACT

A display apparatus includes: a substrate including a main display area, a component area, and a peripheral area; a plurality of main pixel electrodes in the main display area of the substrate; a plurality of auxiliary pixel electrodes in the component area of the substrate; an auxiliary opposite electrode over the auxiliary pixel electrodes, overlapping the auxiliary pixel electrodes, and including a plurality of openings between the auxiliary pixel electrodes; and a shield layer below the auxiliary pixel electrodes and including a plurality of opening portions that overlap the openings of the auxiliary opposite electrode.

21 Claims, 16 Drawing Sheets

(52) U.S. Cl.
CPC ....... *H10K 59/80522* (2023.02); *H10K 59/88* (2023.02); *H10K 59/65* (2023.02)

(58) Field of Classification Search
CPC .... H10K 59/00; H10K 50/814; H10K 50/826; H10K 59/65; H10K 59/352; H10K 50/813; H10K 59/123; H10K 59/353; H10K 59/8792; H01L 27/12; H01L 23/00; H01L 23/52; H01L 23/535; H01L 23/58; H01L 2221/10; H01L 2221/1094; H01L 2223/58
See application file for complete search history.

(56) References Cited

U.S. PATENT DOCUMENTS

| | | | | |
|---|---|---|---|---|
| 11,271,053 | B2 * | 3/2022 | Liang | H10K 59/122 |
| 11,846,860 | B2 * | 12/2023 | Hanada | H10K 59/126 |
| 2018/0089485 | A1 | 3/2018 | Bok | |
| 2019/0129227 | A1 * | 5/2019 | Hanada | H05K 1/189 |
| 2019/0206953 | A1 | 7/2019 | Hsieh et al. | |
| 2020/0119124 | A1 * | 4/2020 | Ahn | H10K 77/111 |
| 2020/0124927 | A1 * | 4/2020 | Kim | G02F 1/134336 |
| 2020/0227494 | A1 * | 7/2020 | Bae | H10K 59/124 |
| 2020/0312927 | A1 * | 10/2020 | Bae | H10D 30/6723 |
| 2021/0313410 | A1 * | 10/2021 | Kim | H10K 59/353 |
| 2021/0327958 | A1 | 10/2021 | Li et al. | |
| 2023/0171990 | A1 * | 6/2023 | Song | H10K 59/124 |
| | | | | 257/40 |

FOREIGN PATENT DOCUMENTS

| | | | | |
|---|---|---|---|---|
| CN | 110783370 A | 2/2020 | | |
| CN | 210245501 U | 4/2020 | | |
| EP | 3640715 A1 * | 4/2020 | ......... | G02F 1/13318 |

* cited by examiner

1

DISPLAY APPARATUS CAPABLE OF DISPLAYING AN IMAGE IN A COMPONENT AREA

CROSS-REFERENCE TO RELATED APPLICATION

The present application claims priority to and the benefit of Korean Patent Application No. 10-2020-0128271, filed on Oct. 5, 2020, in the Korean Intellectual Property Office, the entire disclosure of which is incorporated herein by reference.

BACKGROUND

1. Field

Aspects of one or more embodiments relate to a display apparatus.

2. Description of Related Art

A display apparatus includes display elements and electronic elements configured to control electric signals applied to the display elements. The electronic elements generally include transistors (e.g., thin-film transistors), storage capacitors, and a plurality of wirings.

Recently, the uses of display apparatuses has become more diversified. In addition, as display apparatuses have become thinner and lighter, their range of uses has gradually expanded. As the range of uses of the display apparatuses has become more diversified, various methods have been studied on designing the shape of the display apparatuses.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus in which an image may be displayed in a component area and which is easily manufactured.

In display apparatuses according to the related art, it may be difficult to manufacture display apparatuses in which images may be displayed in a component area.

Aspects of one or more embodiments include a display apparatus in which an image may be displayed in a component area and which is relatively easily manufactured. However, such a technical problem is an example, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes a substrate including a main display area, a component area, and a peripheral area, main pixel electrodes in the main display area of the substrate, auxiliary pixel electrodes in the component area of the substrate, an auxiliary opposite electrode over the auxiliary pixel electrodes, overlapping the auxiliary pixel electrodes, and including openings between the auxiliary pixel electrodes, and a shield layer below the auxiliary pixel electrodes and including opening portions that overlap the openings of the auxiliary opposite electrode.

According to some embodiments, the display apparatus may further include a main opposite electrode over the main pixel electrodes and overlapping the main pixel electrodes.

According to some embodiments, the main opposite electrode may be connected to the auxiliary opposite electrode.

According to some embodiments, the auxiliary opposite electrode may include overlapping portions and connectors, the overlapping portions overlapping the auxiliary pixel electrodes, and the connectors connecting the overlapping portions.

According to some embodiments, the connectors may have a curved shape when viewed from a direction perpendicular to a top surface of the substrate.

According to some embodiments, a melting point of a material of the shield layer may be higher than a melting point of a material of the auxiliary opposite electrode.

According to some embodiments, an area of the shied layer may be the same as or greater than an area of the auxiliary opposite electrode.

According to some embodiments, when viewed from a direction perpendicular to a top surface of the substrate, each of the opening portions may be arranged inside an edge of a corresponding one among the openings.

According to some embodiments, the display apparatus may further include main thin-film transistors in the main display area of the substrate, electrically connected to the main pixel electrodes, and including a main semiconductor layer and a main gate electrode, wherein the shield layer and the main gate electrode are on a same layer.

According to some embodiments, the shield layer and the main gate electrode include a same material.

According to some embodiments, the display apparatus may further include main thin-film transistors in the main display area of the substrate, electrically connected to the main pixel electrodes, and including a main semiconductor layer and a main gate electrode, and a wiring between the main gate electrode and the main pixel electrodes, wherein the shield layer may be arranged on a same layer as the wiring.

According to some embodiments, the shield layer and the wiring are on a same layer.

According to some embodiments, the display apparatus may further include main thin-film transistors in the main display area of the substrate, electrically connected to the main pixel electrodes, and including a main semiconductor layer and a main gate electrode, and a bottom metal layer below the main semiconductor layer, wherein the shield layer may be and the bottom metal layer are on a same layer.

According to some embodiments, the shield layer and the bottom metal layer include a same material.

According to some embodiments, the display apparatus may further include main thin-film transistors in the main display area of the substrate, electrically connected to the main pixel electrodes, and including a main semiconductor layer and a main gate electrode, auxiliary thin-film transistors in the peripheral area of the substrate and including an auxiliary semiconductor layer and an auxiliary gate electrode, and connection wirings electrically connecting the auxiliary thin-film transistors to the auxiliary pixel electrodes.

According to some embodiments, the auxiliary opposite electrode may include overlapping portions and connectors, the overlapping portions overlapping the auxiliary pixel electrodes, and the connectors connecting the overlapping portions, and the connectors may overlap the connection wirings.

According to some embodiments, the shield layer may include main shield portions and connection shield portions, the main shield portions overlapping the auxiliary pixel electrodes, and the connection shield portions connecting the main shield portions, and, in the component area, when viewed from a direction perpendicular to a top surface of the substrate, the connection wirings are arranged in the connection shield portions.

According to some embodiments, the display apparatus may further include main thin-film transistors in the main display area of the substrate, electrically connected to the main pixel electrodes, and including a main semiconductor layer and a main gate electrode, and auxiliary thin-film transistors in the component area of the substrate, electrically connected to the auxiliary pixel electrodes, and including an auxiliary semiconductor layer and an auxiliary gate electrode, wherein the shield layer may be below the auxiliary semiconductor layer.

According to some embodiments, the shield layer may overlap the auxiliary semiconductor layer and the auxiliary gate electrode.

According to some embodiments, the display apparatus may further include an auxiliary wiring in the component area of the substrate and connected to the auxiliary semiconductor layer, wherein the shied layer may overlap the auxiliary wiring.

According to some embodiments, the display apparatus may further include a component below the substrate to correspond to the component area.

These and/or other aspects will become more apparent and more readily appreciated from the following detailed description of the embodiments, the accompanying drawings, and claims.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1A:
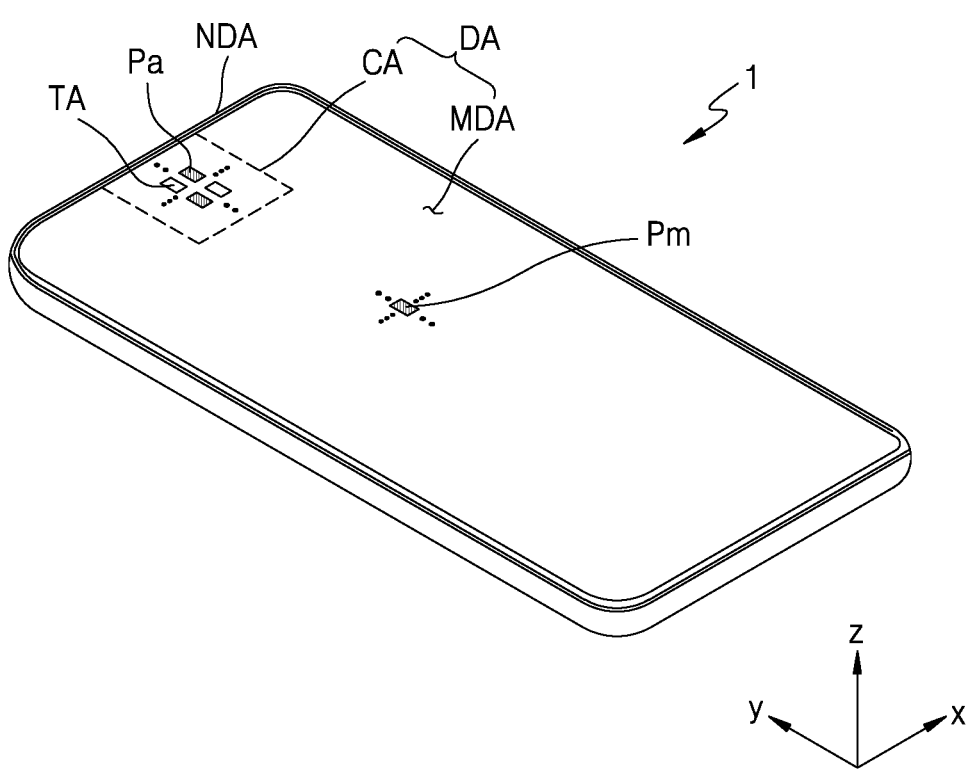
FIGS. 1A to 1C are perspective views of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, aspects of some embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As embodiments according to the present disclosure allow for various changes and numerous embodiments, certain embodiments will be illustrated in the drawings and described in the written description. Effects and features of the disclosure, and methods for achieving them will be clarified with reference to embodiments described below in more detail with reference to the drawings. However, embodiments according to the disclosure are not limited to the following embodiments and may be embodied in various forms.

Hereinafter, aspects of some embodiments will be described with reference to the accompanying drawings, wherein like reference numerals refer to like elements throughout and a repeated description thereof is omitted.

It will be further understood that, when a layer, region, or component is referred to as being "on" another layer, region, or component, it can be directly or indirectly on the other layer, region, or component. That is, for example, intervening layers, regions, or components may be present. Sizes of elements in the drawings may be exaggerated or reduced for convenience of explanation. For example, since sizes and thicknesses of elements in the drawings are arbitrarily illustrated for convenience of explanation, the disclosure is not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1B:
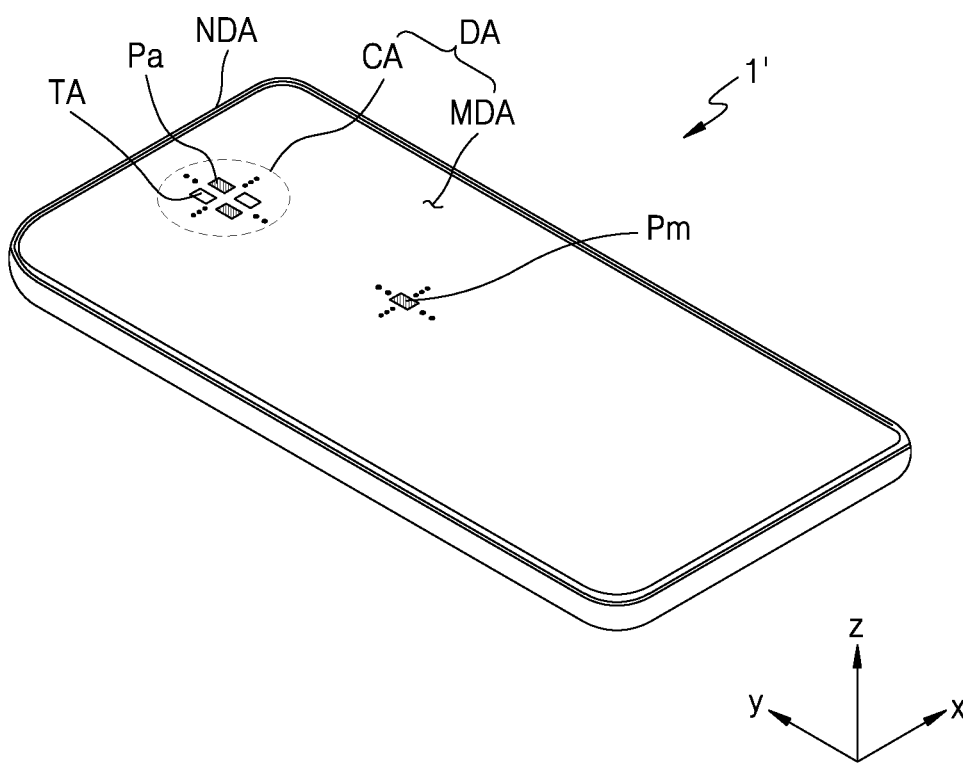
Figure 1C:
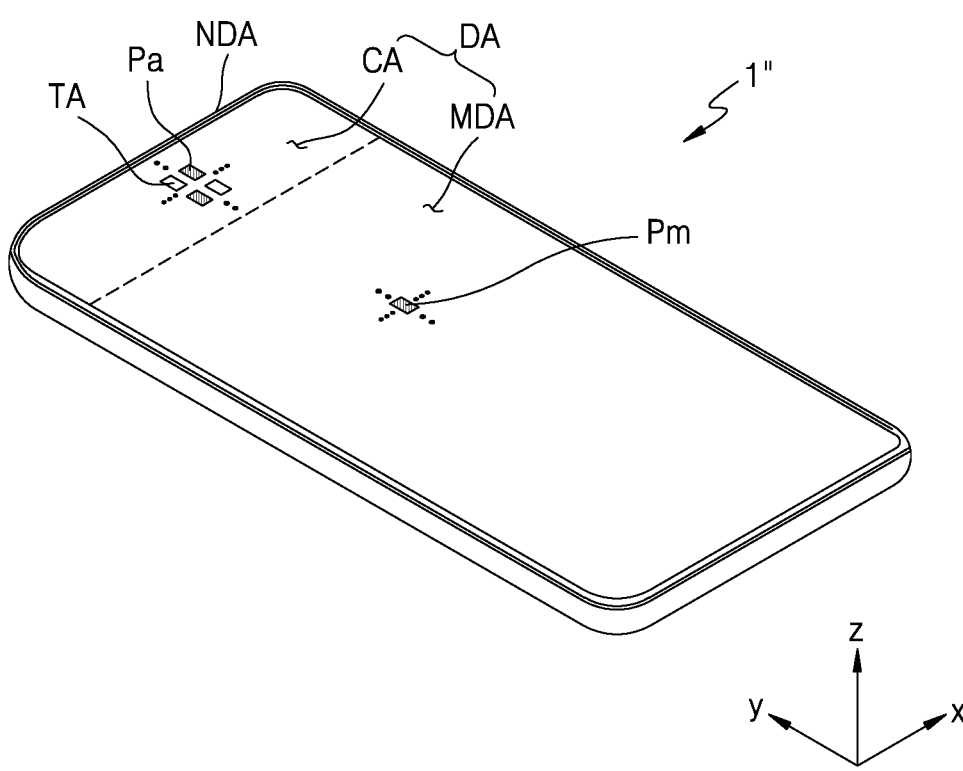

FIGS. 1A to 1C are perspective views of a display apparatus 1 according to some embodiments.

As shown in FIG. 1A, the display apparatus 1 includes a display area DA and a peripheral area NDA outside the display area DA. The display area DA includes a component area CA and a main display area MDA at least partially surrounding the component area CA. The component area CA displays an auxiliary image (or auxiliary images), and the main display area MDA displays a main image (or main images), and thus, the component area CA and the main display area MDA may display an image individually or in cooperation with each other. That is, according to some embodiments, the component area CA may be configured to display images that are distinct or separate from the images displayed in the main display area MDA. The component area CA and the main display area MDA may further be configured to collectively display the same image, where the component area CA displays a first portion of the image, and the main display area MDA displays a second portion of the image, and the first and second portions of the image collectively form the entirety of the image.

The peripheral area NDA may be a kind of non-display area in which display elements are not arranged (e.g., a bezel area). The display area DA may be entirely surrounded by the peripheral area NDA. When the display apparatus 1 includes the main display area MDA, the component area CA, and the peripheral area NDA, it may be understood that a substrate of the display apparatus 1 includes the main display area MDA, the component area CA, and the peripheral area NDA.

It is shown in FIG. 1A that the main display area MDA is arranged to surround at least a portion of one component area CA. That is, one edge of the component area CA may coincide with one edge of the main display area MDA. According to some embodiments, the display apparatus 1 may include two or more component areas CA. The shapes and sizes of the plurality of component areas CA may be different from each other. In a view in a direction approximately perpendicular to the top surface or main display surface of the display apparatus 1 (e.g., in a plan view, or a view perpendicular or normal with respect to the display surface), the component area CA may have various shapes such as circular, elliptical, polygonal, star shapes, or a diamond shape.

It is shown in FIG. 1A that the component area CA is arranged on the top (a (+) y-direction) center of the main display area MDA having an approximately quadrangular shape in a view in a direction approximately perpendicular to the top surface of the display apparatus 1. However, the embodiments according to the present disclosure are not limited thereto, and the component area CA may be arranged on one side of the main display area MDA, which is quadrangular, for example, the top right or top left of the main display area MDA. As an example, as shown in FIG. 1B, a circular component area CA may be arranged inside the main display area MDA. As shown in FIG. 1C, a quadrangular bar-type component area CA may be arranged on one side of the main display area MDA.

The display apparatus 1 may include a plurality of main sub-pixels Pm and a plurality of auxiliary sub-pixels Pa, the plurality of main sub-pixels Pm being arranged in the main display area MDA, and the plurality of auxiliary sub-pixels Pa being arranged in the component area CA.

The display apparatus 1 may include a component 40 (see FIG. 2), which is an electronic element arranged below the display panel to correspond to the component area CA. The component 40 may be an electronic element configured to emit signals or receive signals (e.g., from external devices). Such signals may include, for example, light or sound, or other wireless spectrum. As an example, the electronic element may be a sensor that measures a distance such as a proximity sensor, a sensor that recognizes a portion of a user's body such as a fingerprint, an iris, or a face, a small lamp that outputs light, or an image sensor that captures an image such as a camera.

The electronic element that uses light may use light in various wavelength bands such as visible light, infrared light, or ultraviolet light. The electronic element that uses light may use ultrasonic waves or sound in different frequency bands. According to some embodiments, the component 40 may include sub-components such as a light-emitter and a light-receiver. The light-emitter and the light-receiver may have an integrated structure, or a pair of light-emitter and light-receiver having physically separated structures may constitute one component 40. To prevent the functionality of the component 40 from being reduced, the component area CA may include a transmission area TA through which light and/or sound that is output from the component 40 to the outside or that progresses toward the component 40 from the outside may pass.

In the display apparatus according to some embodiments, when light is allowed to pass through the component area CA, a light transmittance may be 10% or more. According to some embodiments, a light transmittance may be 40% or more, 50% or more, 85% or more, or 90% or more.

The plurality of auxiliary sub-pixels Pa may be arranged in the component area CA. The plurality of auxiliary sub-pixels Pa may display a preset image by emitting light. An image displayed in the component area CA is an auxiliary image. The auxiliary image may have a resolution that is less than the resolution of an image displayed in the main display area MDA. That is, the component area CA includes the transmission area TA through which light and sound may pass. In the case where sub-pixels are not arranged in the transmission area TA, the number of auxiliary sub-pixels Pa per unit area in the component area CA may be less than the number of main sub-pixels Pm per unit area in the main display area MDA.

Hereinafter, description is made using an organic light-emitting display apparatus as the display apparatus 1 according to some embodiments as an example. However, the display apparatus according to some embodiments is not limited thereto. That is, the display apparatus 1 according to some embodiments may be a display apparatus such as an inorganic light-emitting display or a quantum-dot light-emitting display. As an example, an emission layer of a display element of the display apparatus 1 may include an organic material or an inorganic material. In addition, the display apparatus 1 may include quantum dots, an organic material and quantum dots, or an inorganic material and quantum dots.

Figure 2:
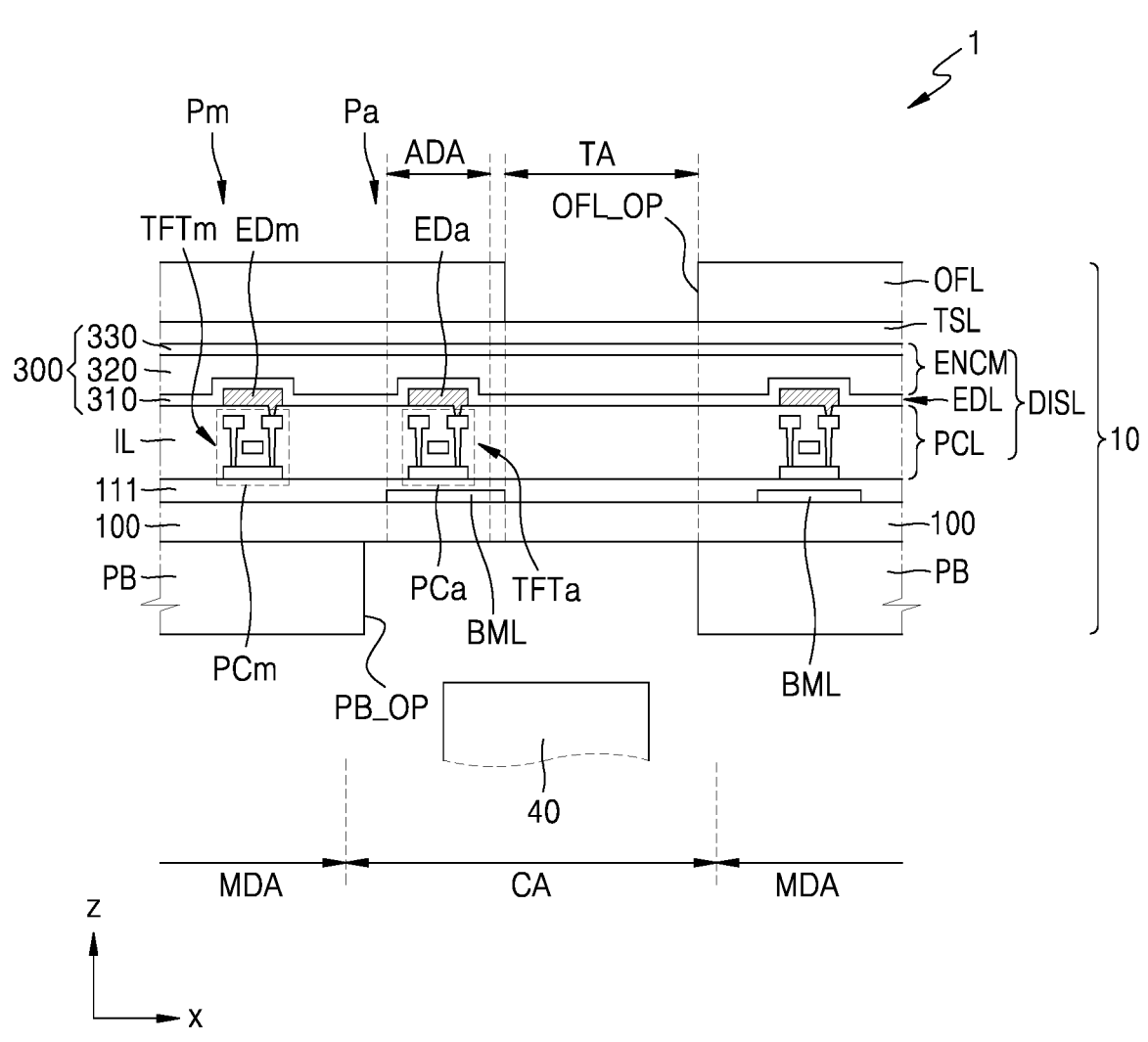
FIG. 2 is a cross-sectional view of a portion of a display apparatus according to some embodiments.

FIG. 2 is a cross-sectional view of a portion of the display apparatus 1 according to some embodiments. As shown in FIG. 2, the display apparatus 1 may include a display panel 10 and the component 40 overlapping the display panel 10. The display apparatus 1 may further include a cover window arranged over the display panel 10 to protect the display panel 10.

The display panel 10 includes the component area CA and the main display area MDA, the component area CA being a region overlapping the component 40, and a main image being displayed in the main display area MDA. The display panel 10 may include a substrate 100, a display layer DISL, a touchscreen layer TSL, an optical functional layer OFL over the substrate 100, and a panel-protecting member PB arranged under the substrate 100. A buffer layer 111 may be arranged between the substrate 100 and the display layer DISL.

The display layer DISL may include a circuit layer PCL, a display element layer EDL, and an encapsulation member ENCM. The circuit layer PCL may include a main thin-film transistor TFTm and an auxiliary thin-film transistor TFTa. The display element layer EDL may include a main light-emitting element EDm and an auxiliary light-emitting element EDa, which are display elements. The encapsulation member ENCM may include a thin-film encapsulation layer 300 and an encapsulation substrate. An insulating layer IL may be arranged inside the display layer DISL.

The substrate 100 may include an insulating material such as glass, quartz, and a polymer resin. The substrate 100 may be a rigid substrate, or a flexible substrate that is bendable, foldable, or rollable.

The main light-emitting element EDm and a main pixel circuit PCm connected thereto may be arranged in the main display area MDA of the display panel 10. The main pixel circuit PCm may include at least one main thin-film transistor TFTm and control an operation of the main light-emitting element EDm. The main sub-pixel Pm may include the main light-emitting element EDm.

The auxiliary light-emitting element EDa and an auxiliary pixel circuit PCa connected thereto may be arranged in the component area CA of the display panel 10. The auxiliary pixel circuit PCa may include at least one auxiliary thin-film transistor TFTa and control an operation of the auxiliary light-emitting element EDa. The auxiliary sub-pixel Pa may include the auxiliary light-emitting element EDa.

A region of the component area CA in which the auxiliary light-emitting element EDa is arranged may be defined as an auxiliary display area ADA. A region of the component area CA in which the auxiliary light-emitting element EDa is not arranged may be defined as the transmission area TA.

The transmission area TA may be a region through which light and/or a signal emitted from the component 40 arranged in the component area CA or light and/or a signal incident to the component 40 passes. The auxiliary display areas ADA and the transmission areas TA may be alternately arranged in the component area CA.

The display element layer EDL may be covered by the thin-film encapsulation layer 300 as shown in FIG. 2. As an example, the thin-film encapsulation layer 300 may include at least one inorganic encapsulation layer and at least one organic encapsulation layer as shown in FIG. 2. It is shown in FIG. 2 that the thin-film encapsulation layer 300 includes a first inorganic encapsulation layer 310, a second inorganic encapsulation layer 330, and an organic encapsulation layer 320 arranged therebetween.

The first inorganic encapsulation layer 310 and the second inorganic encapsulation layer 330 may include at least one inorganic insulating material from among silicon oxide $(SiO_2)$, silicon nitride $(SiN_x)$, silicon oxynitride $(SiO_xN_y)$, aluminum oxide $(Al_2O_3)$, titanium oxide $(TiO_2)$, tantalum oxide $(Ta_2O_5)$, hafnium oxide $(HfO_2)$, and zinc oxide $(ZnO_2)$ and be formed through chemical vapor deposition (CVD). The organic encapsulation layer 320 may include a polymer-based material. The polymer-based material may include an acryl-based resin (e.g. polymethylmethacrylate, poly acrylic acid, etc.), an epoxy-based resin, polyimide, and polyethylene. The first inorganic encapsulation layer 310, the organic encapsulation layer 320, and the second inorganic encapsulation layer 330 may be each formed as one body to cover the main display area MDA and the component area CA.

However, the embodiments according to the present disclosure are not limited thereto, and the display panel 10 may include an encapsulation substrate arranged over the display element layer EDL. In this case, the encapsulation substrate may face the substrate 100 with the display element layer EDL therebetween. There may be a gap between the encapsulation substrate and the display element layer EDL. The encapsulation substrate may include glass. Sealant may be arranged between the substrate 100 and the encapsulation substrate, the sealant including frit. The sealant may be arranged in the peripheral area NDA. The sealant arranged in the peripheral area NDA may prevent moisture from penetrating into the display area DA through the lateral surface of the display area DA while surrounding the display area DA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input through a self-capacitive method or a mutual-capacitive method.

The touchscreen layer TSL may be arranged on the thin-film encapsulation layer 300. Alternatively, the touchscreen layer TSL may be separately formed on a touch substrate and then bonded on the thin-film encapsulation layer 300 through an adhesive layer such as an optically clear adhesive OCA. As an example, the touchscreen layer TSL may be directly formed on the thin-film encapsulation layer 300. In this case, the adhesive layer may not be arranged between the touchscreen layer TSL and the thin-film encapsulation layer 300.

The optical functional layer OFL may include an anti-reflection layer. The optical functional layer OFL may reduce the reflectivity of light (external light) incident toward the display apparatus 1 from the outside. As an example, the optical functional layer OFL may be a polarizing film. The optical functional layer OFL may have an opening OFL_OP corresponding to the transmission area TA. Accordingly, a light transmittance of the transmission area TA may be remarkably improved. The opening OFL_OP may be filled with a transparent material such as an optically clear resin (OCR). Alternatively, the optical functional layer OFL may include a filter plate including a black matrix and color filters.

The panel-protecting member PB may be attached to the bottom of the substrate 100 to support and protect the substrate 100. The panel-protecting member PB may have an opening PB_OP corresponding to the component area CA. The panel-protecting member PB may increase a light transmittance of the component area CA by including the opening PB_OP. The panel-protecting member PB may include polyethylene terephthalate or polyimide.

The area of the component area CA may be greater than an area in which the component 40 is arranged. Accordingly, the area of the opening PB_OP of the panel-protecting member PB may not coincide with the area of the component area CA. Though it is shown in FIG. 2 that the component 40 is apart from the display panel 10 on one side (a (−) z-direction) of the display panel 10, at least a portion of the component 40 may be inserted into the opening PB_OP of the panel-protecting member PB.

In addition, a plurality of components 40 may be arranged in the component area CA. In this case, the components 40 may have different functions. As an example, the components 40 may include at least two of a camera (an imaging element), a solar battery, a flash, a proximity sensor, an illuminance sensor, and an iris sensor.

Figure 3:
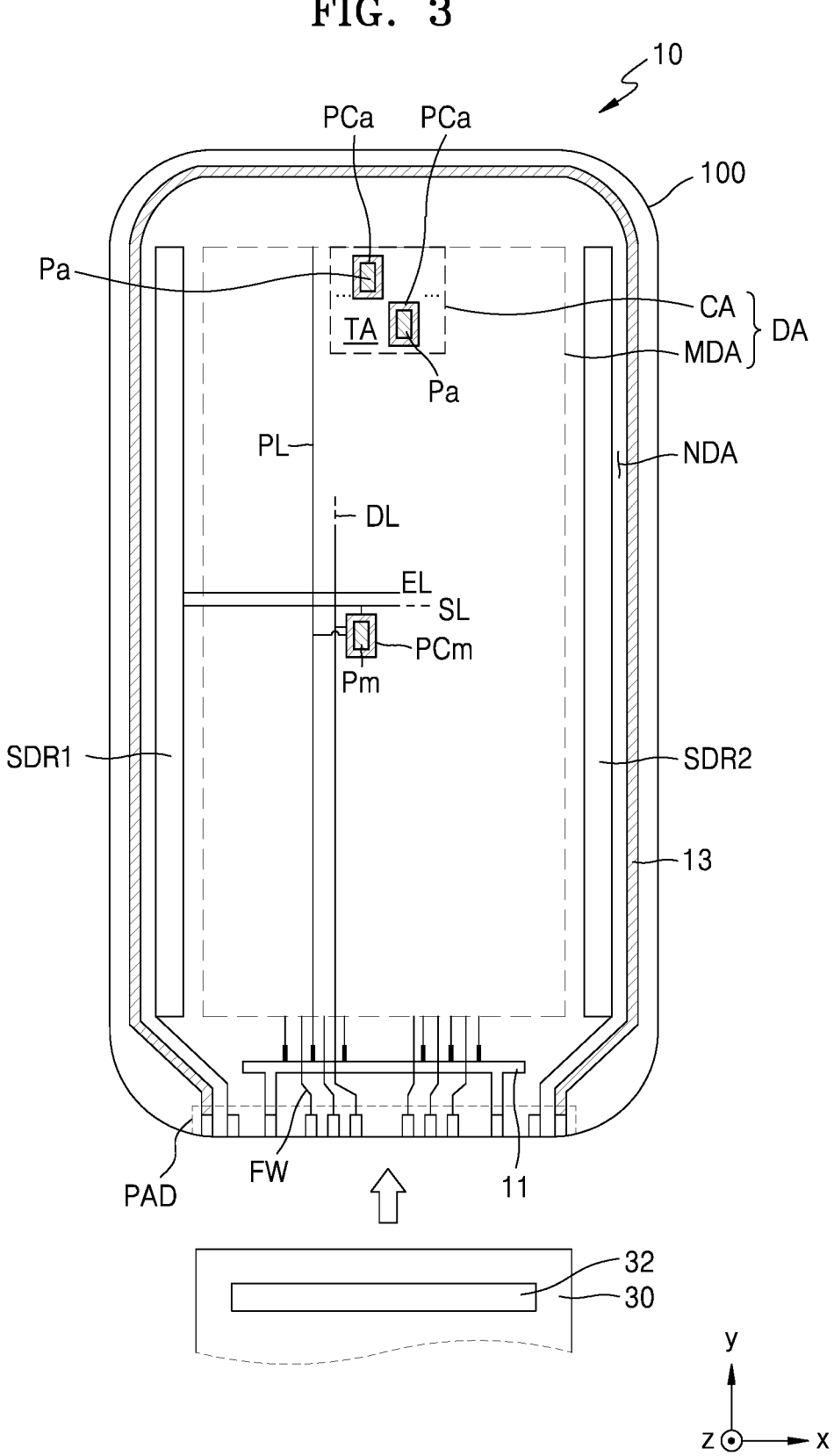
FIG. 3 is a plan view of a display panel that may be included in the display apparatus of FIG. 1B according to some embodiments.

FIG. 3 is a plan view of the display panel 10 that may be included in the display apparatus 1 of FIG. 1A. According to some embodiments, FIG. 3 may be understood as a plan view of the display panel 10 that may be included in the display apparatus 1 of FIG. 1A. Referring to FIG. 3, various kinds of elements constituting the display panel 10 may be arranged over the substrate 100.

A plurality of main sub-pixels Pm are arranged in the main display area MDA. Each of the main sub-pixels Pm may be implemented by a display element such as an organic light-emitting diode OLED. The main pixel circuit PCm that drives the main sub-pixel Pm may be arranged in the main display area MDA. The main pixel circuit PCm may overlap the main sub-pixel Pm. Each main sub-pixel Pm may emit, for example, red, green, blue, or white light. The main display area MDA may be covered by an encapsulation member and protected from external air or moisture, etc.

The component area CA may be arranged on one side of the main display area MDA as described above, or be arranged inside the display area DA and surrounded by the main display area MDA. A plurality of auxiliary sub-pixels Pa are arranged in the component area CA. Each of the auxiliary sub-pixels Pa may be implemented by a display element such as an organic light-emitting diode OLED. The auxiliary pixel circuit PCa that drives the auxiliary sub-pixel Pa may be arranged in the component area CA. The auxiliary pixel circuit PCa may overlap the auxiliary sub-pixel Pa. Each auxiliary sub-pixel Pa may emit, for example, red, green, blue, or white light. The component area CA may be covered by an encapsulation member and protected from external air, moisture, or other contaminants.

As described above, the component area CA may include the transmission area TA. The transmission area TA may surround the plurality of auxiliary sub-pixels Pa. Alternatively, the transmission areas TA may be lattice configurations in cooperation with the plurality of auxiliary sub-pixels Pa. The component area CA includes the transmission area TA, and thus, the resolution of the component area CA may be less than the resolution of the main display area MDA. As an example, the resolution of the component area CA may be about $\frac{1}{2}$, $\frac{3}{8}$, $\frac{1}{3}$, $\frac{1}{4}$, $\frac{2}{9}$, $\frac{1}{8}$, $\frac{1}{9}$, or $\frac{1}{16}$ of the resolution of the main display area MDA. As an example, the resolution of the main display area MDA may be 400 ppi or more, and the resolution of the component area CA may be about 200 ppi or about 100 ppi.

The main pixel circuit PCm and the auxiliary pixel circuit PCa that respectively drive the main sub-pixel Pm and the auxiliary sub-pixel Pa may be electrically connected to outer circuits arranged in the peripheral area NDA. A first scan driving circuit SDR1, a second scan driving circuit SDR2, a terminal portion PAD, a driving voltage supply line 11, and a common voltage supply line 13 may be arranged in the peripheral area NDA.

The first scan driving circuit SDR1 and the second scan driving circuit SDR2 may be symmetrical to each other around the main display area MDA. The first scan driving circuit SDR1 and the second scan driving circuit SDR2 may apply a scan signal to the main pixel circuit PCm through a scan line SL, the main pixel circuit PCm driving the main sub-pixel Pm. In addition, the first scan driving circuit SDR1 and the second scan driving circuit SDR2 may apply an emission control signal to each pixel circuit through an emission control line EL. Some of the main pixel circuits PCm of the main sub-pixels Pm in the main display area MDA may be electrically connected to the first scan driving circuit SDR1, and the rest may be electrically connected to the second scan driving circuit SDR2.

The terminal portion PAD may be arranged on one side of the substrate 100. The terminal portion PAD is exposed by not being covered by an insulating layer, and thus, be electrically connected to the display circuit board 30. A display driver 32 may be arranged on the display circuit board 30.

The display driver 32 may generate a control signal to be transferred to the first scan driving circuit SDR1 and the second scan driving circuit SDR2. The display driver 32 may generate a data signal, and the generated data signal may be transferred to the main pixel circuit PCm through a fan-out wiring FW and a data line DL connected to the fan-out wiring FW.

The display driver 32 may supply a driving voltage ELVDD to the driving voltage supply line 11 and supply a common voltage ELVSS to the common voltage supply line 13. The driving voltage ELVDD may be applied to the pixel circuits of the main sub-pixel Pm and the auxiliary sub-pixel Pa through a driving voltage line PL connected to the driving voltage supply line 11. The common voltage ELVSS may be connected to the common voltage supply line 13 and applied to an opposite electrode of a display element.

The driving voltage supply line 11 may extend in an x-direction below the main display area MDA. The common voltage supply line 13 may have a loop shape having one open side to partially surround the main display area MDA.

Though FIG. 3 shows the case where there is one component area CA, the display panel 10 may include a plurality of component areas CA. In this case, the plurality of component areas CA may be apart from each other. A first camera may be arranged to correspond to one component area CA, and a second camera may be arranged to correspond to another component area CA. Alternatively, a camera may be arranged to correspond to one component area CA, and an infrared sensor may be arranged to correspond to another component area CA. The shapes and sizes of the plurality of component areas CA may be different from each other.

Figure 4:
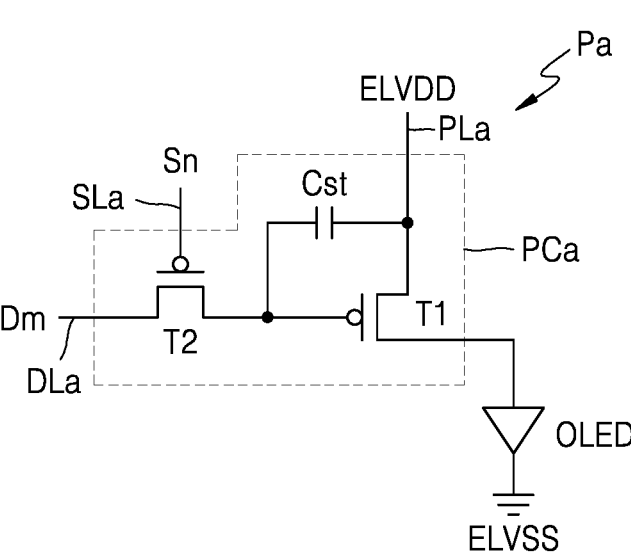
FIG. 4 is an equivalent circuit diagram of a pixel circuit that may be included in the display apparatus of FIGS. 1A to 1C according to some embodiments.

FIG. 4 is an equivalent circuit diagram of a pixel circuit that may be included in the display apparatus 1 of FIGS. 1A to 1C. As shown in FIG. 4, the auxiliary sub-pixel Pa includes the auxiliary pixel circuit PCa and an organic light-emitting diode OLED as a display element connected to the auxiliary pixel circuit PCa. The main sub-pixel Pm may include the main pixel circuit PCm and an organic light-emitting diode OLED as a display element connected to the main pixel circuit PCm, the main pixel circuit PCm being the same as/similar to the auxiliary pixel circuit PCa as shown in FIG. 4.

As shown in FIG. 4, the auxiliary pixel circuit PCa includes a driving thin-film transistor T1, a switching thin-film transistor T2, and a storage capacitor Cst. The switching thin-film transistor T2 is connected to an auxiliary scan line SLa and an auxiliary data line DLa, and transfers a data signal Dm to the driving thin-film transistor T1 according to a scan signal Sn input through the auxiliary scan line SLa, the data signal Dm being input through the auxiliary data line DLa. The storage capacitor Cst is connected to the switching thin-film transistor T2 and an auxiliary driving voltage line PLa, and stores a voltage corresponding to a difference between a voltage transferred from the switching thin-film transistor T2 and the driving voltage ELVDD supplied to the auxiliary driving voltage line PLa.

The driving thin-film transistor T1 may be connected to the auxiliary driving voltage line PLa and the storage capacitor Cst, and may control a driving current flowing through the organic light-emitting diode OLED from the auxiliary driving voltage line PLa according to the voltage stored in the storage capacitor Cst. The organic light-emitting diode OLED may emit light having a preset brightness according to the driving current.

Though FIG. 4 describes the case where the auxiliary pixel circuit PCa includes two thin-film transistors and one storage capacitor, the embodiments according to the present disclosure are not limited thereto. According to some embodiments, the auxiliary pixel circuit PCa may include seven thin-film transistors and one storage capacitor.

According to some embodiments, the auxiliary pixel circuit PCa may include two or more storage capacitors.

Additionally, according to some embodiments, the auxiliary sub-pixel Pa may include additional components or fewer components without departing from the spirit and scope of embodiments of the present disclosure.

Figure 5:
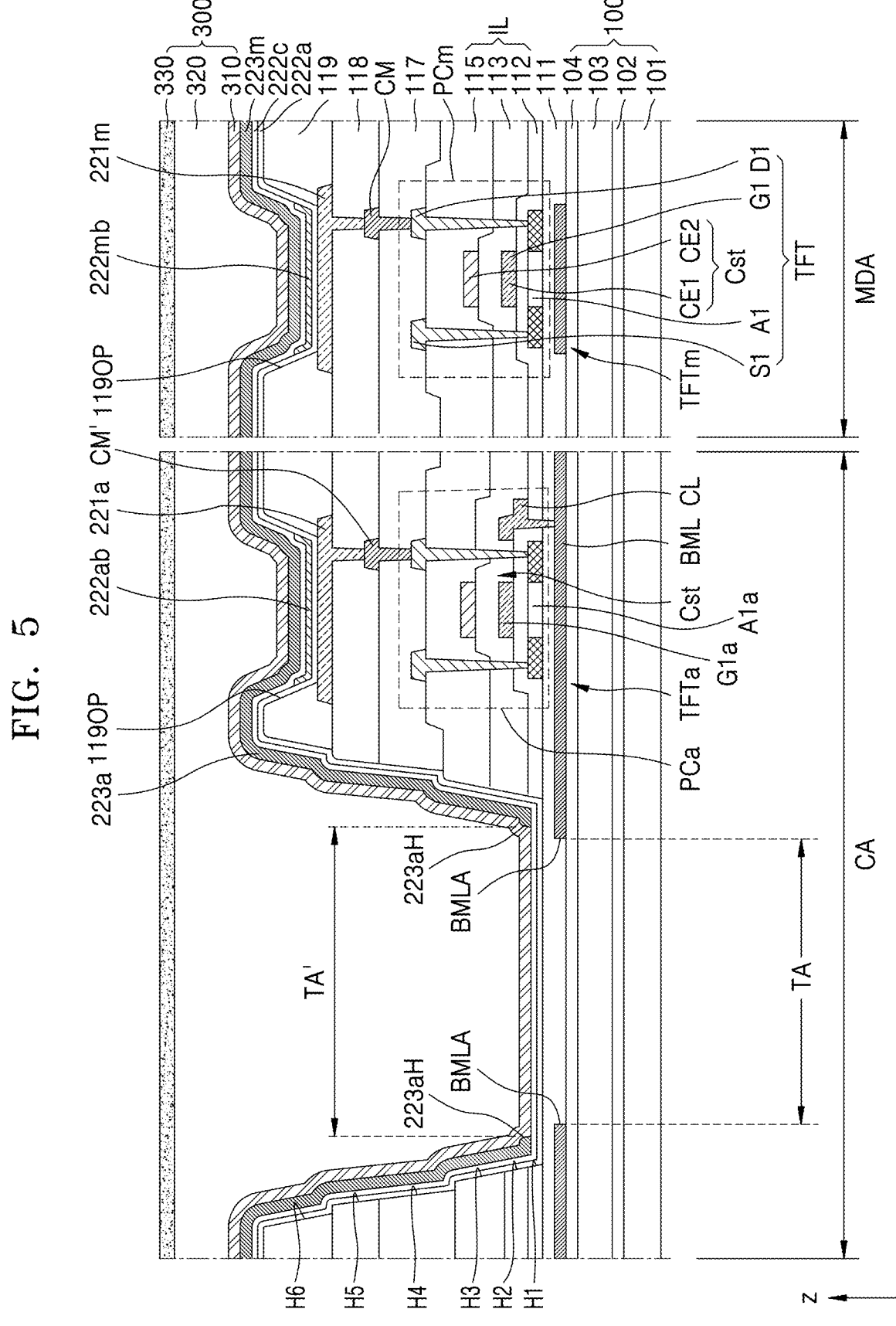
FIG. 5 is a cross-sectional view of a portion of a display apparatus according to some embodiments.

FIG. 5 is a cross-sectional view of a portion of the display apparatus 1 according to some embodiments.

The substrate 100 may include various materials as described above and have a multi-layered structure as shown in FIG. 5. According to some embodiments, the substrate 100 may include a first base layer 101, a first inorganic layer 102, a second base layer 103, and a second inorganic layer 104 that are sequentially stacked.

The first base layer 101 and the second base layer 103 may each include a polymer resin. The polymer resin may include polyethersulfone, polyarylate, polyetherimide, polyethylene naphthalate, polyethylene terephthalate, polyphenylene sulfide, polyimide, polycarbonate, cellulose triacetate, or cellulose acetate propionate. The polymer resin may be transparent.

The first inorganic layer 102 and the second inorganic layer 104 may each be barrier layers preventing penetration of an external foreign substance. The first inorganic layer 102 and the second inorganic layer 104 may each include a single layer or a multi-layer including an inorganic material such as silicon nitride, silicon oxynitride, and/or silicon oxide.

The buffer layer 111 may reduce or block the penetration of a foreign substance, moisture, or external air from below the substrate 100 and planarize the top surface of the substrate 100. The buffer layer 111 may include an inorganic insulating material such as silicon nitride, silicon oxynitride, and/or silicon oxide and have a single-layered or multi-layered structure including the above materials.

The main pixel circuit PCm and the auxiliary pixel circuit PCa each including the thin-film transistor TFT and the storage capacitor Cst may be arranged on the buffer layer 111. The main pixel circuit PCm may be arranged in the main display area MDA, and the auxiliary pixel circuit PCa may be arranged in the component area CA. The main pixel circuit PCm of the main display area MDA and the auxiliary pixel circuit PCa of the component area CA may each have the same structure.

A bottom metal layer BML may be arranged between the auxiliary pixel circuit PCa and the substrate 100 in the component area CA. The bottom metal layer BML may prevent light that is emitted from the component 40 or progressing to the component 40 from being diffracted through a narrow gap between wirings connected to the auxiliary pixel circuit PCa, or improve the performance of the auxiliary thin-film transistor TFTa. There is no bottom metal layer BML in the transmission area TA. As an example, the bottom metal layer BML may have opening portions BMLA corresponding to the transmission area TA. That is, the opening portions BMLA of the bottom metal layer BML may define the transmission area TA of the component area CA.

The bottom metal layer BML may be electrically connected to a connection line CL. The connection line CL may be electrically connected to a line connected to the auxiliary pixel circuit PCa, the storage capacitor Cst, or the auxiliary thin-film transistor TFTa of the auxiliary pixel circuit PCa. As an example, the bottom metal layer BML may be electrically connected to a gate electrode, a source electrode, or a drain electrode of the auxiliary thin-film transistor TFTa of the auxiliary pixel circuit PCa, or electrically connected to the driving voltage line PL (see FIG. 3) or one of capacitor plates of the storage capacitor Cst.

As shown in FIG. 5, according to some embodiments, the bottom metal layer BML may be arranged also in the main display area MDA to improve the performance of the main thin-film transistor TFTm of the main pixel circuit PCm. In this case, the bottom metal layer BML is arranged below a main semiconductor layer A1 of the main thin-film transistor TFTm. In addition, the bottom metal layer BML located below the main semiconductor layer A1 of the main thin-film transistor TFTm and the bottom metal layer BML, which is a shield layer located below an auxiliary semiconductor layer of the auxiliary thin-film transistor TFTa, may include same material and have same layered-structure.

The main thin-film transistor TFTm of the main pixel circuit PCm arranged in the main display area MDA may include the main semiconductor layer A1, a main gate electrode G1, a source electrode S1, and a drain electrode D1, the main gate electrode G1 overlapping a channel region of the main semiconductor layer A1, and the source electrode S1 and the drain electrode D1 being respectively connected to a source region and a drain region of the main semiconductor layer A1. A gate insulating layer 112 may be arranged between the main semiconductor layer A1 and the main gate electrode G1. A first interlayer insulating layer 113 and a second interlayer insulating layer 115 may be arranged between the main gate electrode G1 and the source electrode S1 or between the main gate electrode G1 and the drain electrode D1.

The storage capacitor Cst may overlap the thin-film transistor TFT. The storage capacitor Cst may include a first capacitor plate CE1 and a second capacitor plate CE2 overlapping each other. According to some embodiments, the main gate electrode G1 of the thin-film transistor TFT and the first capacitor plate CE1 of the storage capacitor Cst may be one body. The first interlayer insulating layer 113 may be arranged between the first capacitor plate CE1 and the second capacitor plate CE2.

The main semiconductor layer A1 may include polycrystalline silicon. According to some embodiments, the main semiconductor layer A1 may include amorphous silicon. According to some embodiments, the main semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The main semiconductor layer A1 may include a channel region, a source region, and a drain region, the source region and the drain region being doped with impurities.

The gate insulating layer 112 may include an inorganic insulating material such as silicon nitride, silicon oxynitride, or silicon oxide and have a single-layered or multi-layered structure including the above materials.

The main gate electrode G1 or the first capacitor plate CE1 may include a low-resistance conductive material such as molybdenum (Mo), aluminum (Al), copper (Cu), and/or titanium (Ti) and have a single-layered or multi-layered structure including the above materials. As an example, the main gate electrode G1 may have a three-layered structure of a Mo-layer/an Al-layer/a Mo-layer.

The first interlayer insulating layer 113 may include an inorganic insulating material such as silicon nitride, silicon oxynitride, or silicon oxide and have a single-layered or multi-layered structure including the above materials.

The second capacitor plate CE2 may include any suitable conductive material including, for example, aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered or multi-layered structure including the above materials.

The second interlayer insulating layer 115 may include an inorganic insulating material such as silicon nitride, silicon oxynitride, or silicon oxide and have a single-layered or multi-layered structure including the above materials.

The source electrode S1 or the drain electrode D1 may include any suitable conductive material including, for example, aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered or multi-layered structure including the above materials. As an example, the source electrode S1 or the drain electrode D1 may each have a three-layered structure of a Ti-layer/an Al-layer/a Ti-layer.

The main pixel circuit PCm may be electrically connected to a main pixel electrode 221m arranged in the main display area MDA, the main pixel circuit PCm including the main thin-film transistor TFTm and the storage capacitor Cst. As an example, as shown in FIG. 5, the main pixel circuit PCm may be electrically connected to the main pixel electrode 221m through a contact metal CM, which is a connection wiring.

The contact metal CM may be arranged on a first planarization layer 117 and connected to the main pixel circuit PCm through a contact hole formed in the first planarization layer 117. The contact metal CM may include any suitable conductive material including, for example, aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered or multi-layered structure including the above materials.

The first planarization layer 117 may include an organic insulating material. The first planarization layer 117 may include an organic insulating material such as benzocyclobutene (BCB), polyimide, or hexamethyldisiloxane (HMDSO). The organic insulating material of the first planarization layer 117 may be a photosensitive organic insulating material.

A second planarization layer 118 is arranged on the contact metal CM. The second planarization layer 118 may include an organic insulating material. The second planarization layer 118 may include an organic insulating material such as benzocyclobutene (BCB), polyimide, or hexamethyldisiloxane (HMDSO). The organic insulating material of the second planarization layer 118 may be a photosensitive organic insulating material.

The main pixel electrode 221m may be arranged on the second planarization layer 118. The main pixel electrode 221m may be connected to the contact metal CM through a contact hole of the second planarization layer 118.

The main pixel electrode 221m may include a reflective layer including any suitable conductive material with reflective properties including, for example, silver (Ag), magnesium (Mg), aluminum (Al), platinum (Pt), palladium (Pd), gold (Au), nickel (Ni), neodymium (Nd), iridium (Ir), chrome (Cr), or a compound thereof. The main pixel electrode 221m may include a reflective layer including any suitable conductive material with reflective materials such as the above materials, and a transparent conductive layer arranged on and/or under the reflective layer. The transparent conductive layer may include any suitable transparent conductive material, for example, indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the main pixel electrode 221m may have a three-layered structure of an ITO-layer/a Ag-layer/an ITO-layer that are sequentially stacked.

Up to this point, though description is made to the main pixel circuit PCm and the main pixel electrode 221m arranged in the main display area MDA, the description is applicable to the auxiliary pixel circuit PCa and an auxiliary pixel electrode 221a arranged in the component area CA. That is, the auxiliary thin-film transistor TFTa of the auxiliary pixel circuit PCa located in the component area CA and the main thin-film transistor TFTm of the main pixel circuit PCm may have same or similar structure. An auxiliary pixel electrode 221a located in the component area CA and the main pixel electrode 221m may have same or similar structure. It is shown in FIG. 5 that the auxiliary pixel electrode 221a is electrically connected to the auxiliary thin-film transistor TFTa through a contact metal CM', which is a connection wiring, the auxiliary thin-film transistor TFTa including an auxiliary semiconductor layer A1a and an auxiliary gate electrode G1a. The description of the contact metal CM is applicable to the contact metal CM'.

A pixel-defining layer 119 may be arranged on the main pixel electrode 221m and the auxiliary pixel electrode 221a. The pixel-defining layer 119 may cover the edges of the main pixel electrode 221m and the auxiliary pixel electrode 221a and include an opening 119OP that overlaps the central portions of the main pixel electrode 221m and the auxiliary pixel electrode 221a. The pixel-defining layer 119 may include an organic insulating material such as polyimide, polyamide, an acrylic resin, benzocyclobutene (BCB), hexamethyldisiloxane (HMDSO), or a phenolic resin.

A first functional layer 222a and a second functional layer 222c are arranged on the pixel-defining layer 119, the main pixel electrode 221m, and the auxiliary pixel electrode 221a. The first functional layer 222a and the second functional layer 222c may each be provided as one body to cover the entire main display area MDA and the entire component area CA.

The first functional layer 222a may include a single layer or a multi-layer. As an example, in the case where the first functional layer 222a includes a polymer material, the first functional layer 222a may include a hole transport layer (HTL), which has a single-layered structure, and include poly(3,4-ethylenedioxythiophene) (PEDOT) or polyaniline (PANI). In the case where the first functional layer 222a includes a low molecular weight material, the first functional layer 222a may include a hole injection layer (HIL) and a hole transport layer (HTL).

According to some embodiments, the second functional layer 222c may be omitted. As an example, in the case where the first functional layer 222a includes a polymer material, the second functional layer 222c may be arranged on the first functional layer 222a. The second functional layer 222c may include a single layer or a multi-layer. The second functional layer 222c may include an electron transport layer (ETL) and/or an electron injection layer (EIL).

A main emission layer 222mb or an auxiliary emission layer 222ab is arranged on the first functional layer 222a or between the first functional layer 222a and the second functional layer 222c. The main emission layer 222mb may have a shape patterned to correspond to the main pixel electrode 221m. The auxiliary emission layer 222ab may have a shape patterned to correspond to the auxiliary pixel electrode 221a. The main emission layer 222mb and the auxiliary emission layer 222ab may each include an organic material. The main emission layer 222mb and the auxiliary emission layer 222ab may each include a polymer organic material or a low molecular weight organic material that emits light of a preset color.

An auxiliary opposite electrode 223a is arranged over the auxiliary emission layer 222ab, the auxiliary opposite electrode 223a overlapping the auxiliary pixel electrode 221a. A main opposite electrode 223m is arranged over the main emission layer 222mb, the main opposite electrode 223m overlapping the main pixel electrode 221m. The auxiliary opposite electrode 223a and the main opposite electrode 223m may be provided as one body (e.g., as one continuous material). The auxiliary opposite electrode 223a and the main opposite electrode 223m may each include a conductive material having a relatively low work function. As an example, the auxiliary opposite electrode 223a and the main opposite electrode 223m may include a (semi) transparent layer including silver (Ag), magnesium (Mg), aluminum (Al), nickel (Ni), chrome (Cr), calcium (Ca), or an alloy thereof. Alternatively, the auxiliary opposite electrode 223a and the main opposite electrode 223m may each further include a layer including ITO, IZO, ZnO, or $In_2O_3$ on/under the (semi) transparent layer including the above material. According to some embodiments, the auxiliary opposite electrode 223a and the main opposite electrode 223m may each include silver (Ag) and magnesium (Mg).

A stacked structure of the main pixel electrode 221m, the main emission layer 222mb, and the main opposite electrode 223m that are sequentially stacked may constitute a light-emitting diode, for example, an organic light-emitting diode OLED. A stacked structure of the auxiliary pixel electrode 221a, the auxiliary emission layer 222ab, and the auxiliary opposite electrode 223a may also constitute a light-emitting diode, for example, an organic light-emitting diode OLED. The organic light-emitting diode OLED may emit light (e.g., a set or predetermined color of light) such as red, green, or blue light. An emission area of each organic light-emitting diode OLED corresponds to a pixel (or sub-pixel). As an example, the main sub-pixel Pm corresponds to an emission area of the organic light-emitting diode OLED arranged in the main display area MDA. The auxiliary sub-pixel Pa corresponds to an emission area of the organic light-emitting diode OLED arranged in the component area CA. The opening 119OP of the pixel-defining layer 119 defines the size and/or width of the emission area, and thus, the size and/or width of the main sub-pixel Pm and the auxiliary sub-pixel Pa may depend on the opening 119OP of the pixel-defining layer 119.

The organic light-emitting diode OLED may be covered by the first inorganic encapsulation layer 310, the second inorganic encapsulation layer 330, and the organic encapsulation layer 320 therebetween.

Referring to the transmission area TA of FIG. 5, insulating layers on the substrate 100 may respectively include holes formed in the transmission area TA. As an example, as shown in FIG. 5, the gate insulating layer 112, the first interlayer insulating layer 113, the second interlayer insulating layer 115, the first planarization layer 117, the second planarization layer 118, and the pixel-defining layer 119 may respectively include a first hole H1, a second hole H2, a third hole H3, a fourth hole H4, a fifth hole H5, and a sixth hole H6 each being arranged in the transmission area TA and overlapping each other. In this case, the first functional layer 222a may be arranged on the buffer layer 111.

The first functional layer 222a and the second functional layer 222c may each cover the transmission area TA. In contrast, the auxiliary opposite electrode 223a may include an opening 223aH formed in the transmission area TA to improve a transmittance of the transmission area TA. The opening 223aH of the auxiliary opposite electrode 223a may correspond to an opening portion BMLA of the bottom meta layer BML. The opening 223aH of the auxiliary opposite electrode 223a may be formed by irradiating a laser beam. That is, the opening 223aH of the auxiliary opposite electrode 223a may be formed by forming the auxiliary opposite electrode 223a to cover the transmission area TA, and then irradiating a laser beam to a portion of the auxiliary opposite electrode 223a that corresponds to the transmission area TA to remove the relevant portion.

When irradiating a laser beam to form the opening 223aH of the auxiliary opposite electrode 223a, the laser beam may only be irradiated to a portion of the auxiliary opposite electrode 223a set in advance. For this purpose, as described above, the bottom metal layer BML may be allowed to include the opening portion BMLA. That is, the laser beam may be irradiated to the bottom metal layer BML through the substrate 100, and thus, the laser beam may be irradiated to a portion of the auxiliary opposite electrode 223a that corresponds to the opening portion BMLA of the bottom metal layer BML. Accordingly, the opening 223aH may be formed in the auxiliary opposite electrode 223a. Simultaneously (or concurrently), the bottom metal layer BML shields the laser beam during the process of irradiating the laser-beam, and thus, elements of the auxiliary pixel circuit PCa arranged thereon, for example, the auxiliary thin-film transistor TFTa from being damaged by the laser beam, the auxiliary thin-film transistor TFTa including the auxiliary semiconductor layer and the auxiliary gate electrode. In this aspect, the bottom metal layer BML may serve as a shield layer.

As described above, the openings 223aH corresponding to the opening portions BMLA of the bottom metal layer BML are formed in the auxiliary opposite electrodes 223a by irradiating the laser beam to the bottom metal layer BML through the substrate 100, and thus, the openings 223aH of the auxiliary opposite electrodes 223a overlap the opening portions BMLA of the bottom metal layer BML in a view in a direction perpendicular to the substrate 100. The bottom metal layer BML, which is the shied layer, overlaps the auxiliary gate electrode of the auxiliary semiconductor layer of the auxiliary thin-film transistor TFTa. In the case where there are auxiliary wirings electrically connected to the auxiliary semiconductor layer inside the component area CA, the bottom metal layer BML may overlap the auxiliary wirings, and thus, protect the auxiliary wirings.

Though the laser beam is irradiated to the opening portions BMLA of the bottom metal layer BML, the laser beam may be diffracted while passing through the opening portions BMLA of the bottom metal layer BML, and thus, the width of the laser beam may be slightly widened. Accordingly, in a view in a direction perpendicular to the substrate 100 (e.g., a plan view), as shown in FIG. 5, the area of the transmission area TA' defined by each of the openings 223aH of the auxiliary opposite electrodes 223a may be slightly greater than the area of the transmission area TA defined by the opening portion BMLA of the bottom metal layer BML corresponding thereto. Depending on the case, the area of the transmission area TA' defined by each of the openings 223aH of the auxiliary opposite electrodes 223a may be the same as the area of the transmission area TA defined by the opening portion BMLA of the bottom metal layer BML corresponding thereto.

As described above, during the process of irradiating the laser beam, a portion of the auxiliary opposite electrode 223a to which the laser beam is irradiated may be removed, but a portion of the bottom metal layer BML to which the laser beam is irradiated may not be removed. For this purpose, a melting point of a material of the bottom metal layer BML, which is the shield layer, needs to be higher than a melting point of a material of the auxiliary opposite electrode 223a. As an example, the bottom metal layer BML may include molybdenum (Mo), copper (Cu), and/or titanium (Ti). The bottom metal layer BML may include a material having a higher melting point than a melting point of the material of the auxiliary opposite electrode 223a from among these materials.

Figure 6:
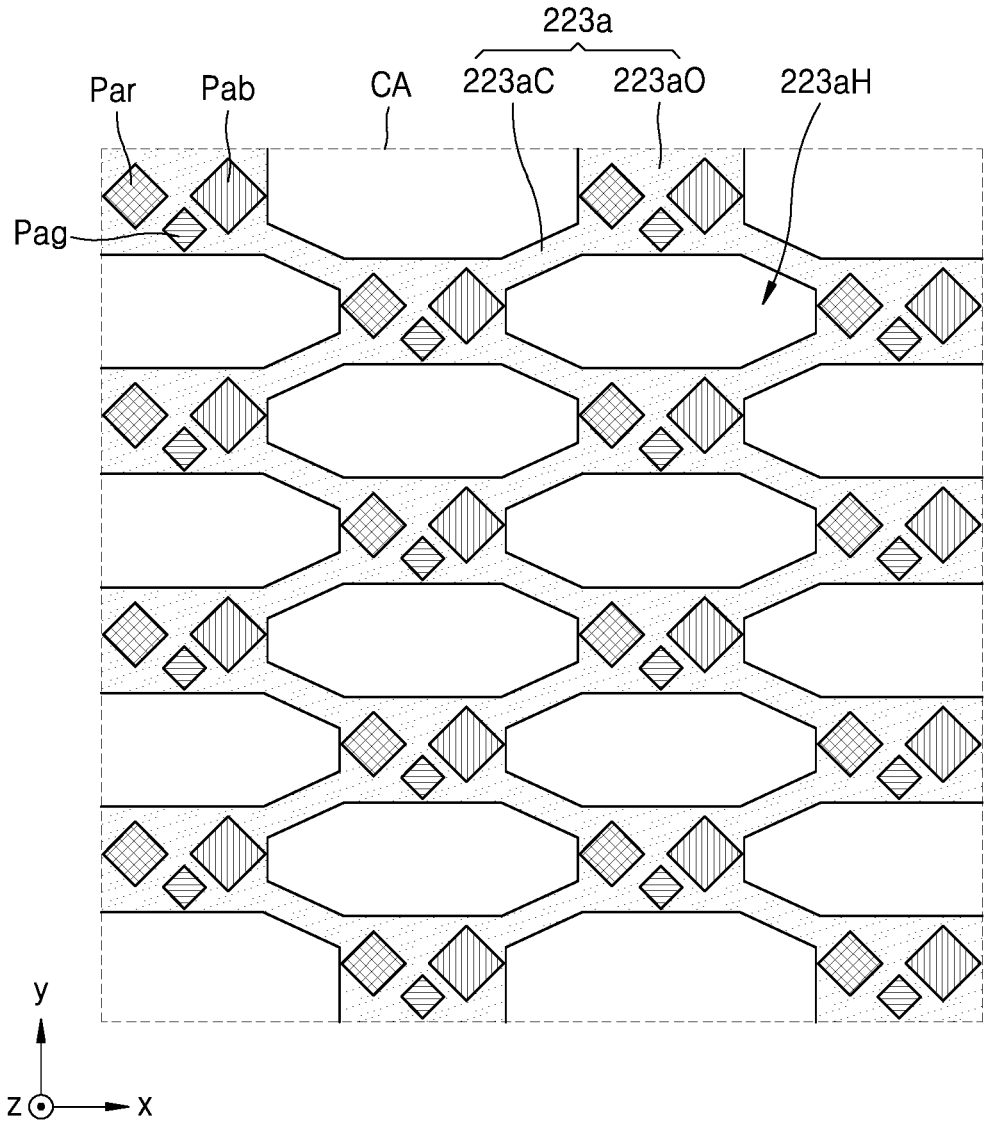
FIG. 6 is a plan view of a portion of a display apparatus according to some embodiments.

FIG. 6 is a plan view of a portion of the display apparatus 1 according to some embodiments. As shown in FIG. 6, the auxiliary opposite electrode 223a includes overlapping portions 223aO and connectors 223aC in the component area CA, the overlapping portions 223aO overlapping the auxiliary pixel electrodes 221a, and the connectors 223aC connecting the overlapping portions 223aO. As described above, the openings 223aH of the auxiliary opposite electrode 223a may be defined by portions surrounded by the overlapping portions 223aO and the connectors 223aC.

For reference, FIG. 6 shows a red sub-pixel Par, a green sub-pixel Pag, and a blue sub-pixel Pab inside the component area CA, and thus, these may be understood to correspond to the auxiliary pixel electrodes 221a inside the component area CA. As described above, in a view in a direction perpendicular to the substrate 100 (e.g., a plan view), the auxiliary opposite electrode 223a overlaps the auxiliary pixel electrode 221a inside the component area CA.

As described above, the auxiliary pixel electrode 221a is electrically connected to the auxiliary thin-film transistor TFTa through the contact metal CM', which is the connection wiring, the auxiliary thin-film transistor TFTa including the auxiliary semiconductor layer and the auxiliary gate electrode. When the contact metal CM' is disconnected, the electrical connection between the auxiliary thin-film transistor TFTa and the auxiliary pixel electrode 221a becomes impossible. Accordingly, the connector 223aC of the auxiliary opposite electrode 223a overlaps the contact metal CM', which is the connection wiring, and thus, the contact metal CM', which is the connection wiring, may not be damaged by the laser beam during the manufacturing process.

Figure 7:
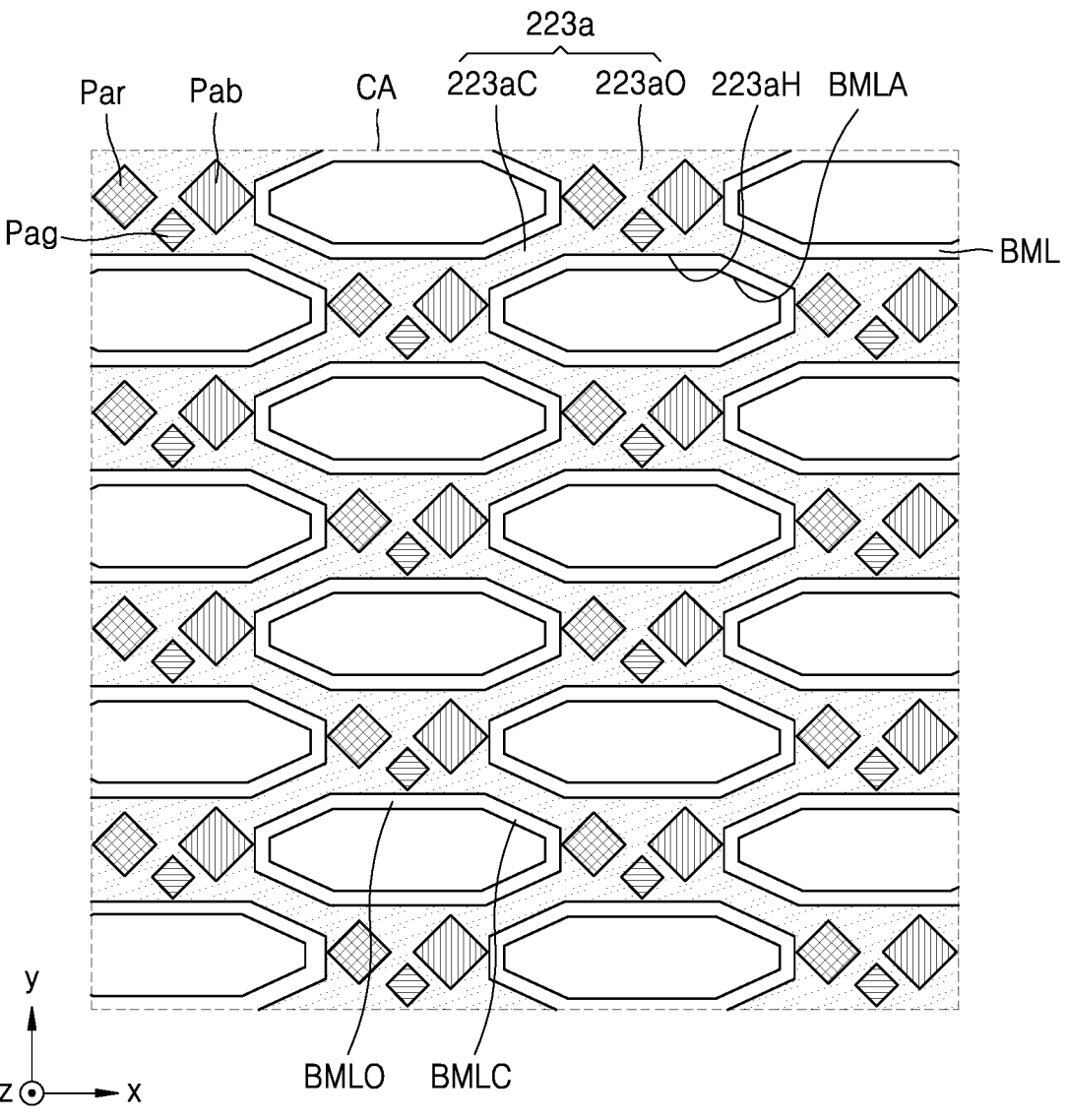
FIG. 7 is a plan view of a portion of a display apparatus according to some embodiments.

FIG. 7 is a plan view of a portion of the display apparatus 1 according to some embodiments and shows a red sub-pixel Par, a green sub-pixel Pag, and a blue sub-pixel Pab, the auxiliary opposite electrode 223a, and the bottom metal layer BML, which is the shield layer, in the component area CA. As described above, the area of each of the openings 223aH of the auxiliary opposite electrode 223a may be greater than the area of the opening portion BMLA of the bottom metal layer BML corresponding thereto. That is, when it is interpreted reversely, the area of the bottom metal layer BML, which is the shield layer, may be the same as or greater than the area of the auxiliary opposite electrode 223a in the component area CA.

As described above, in a view in a direction perpendicular to the substrate 100, the area of the transmission area TA' defined by each of the openings 223aH of the auxiliary opposite electrodes 223a may be slightly greater than the area of the transmission area TA defined by the opening portion BMLA of the bottom metal layer BML corresponding thereto. Accordingly, it is shown in FIG. 7 that each of the opening portions BMLA of the bottom metal layer BML is arranged inside an orthogonal projection image of a corresponding opening 223aH onto the bottom metal layer BML from among the openings 223aH of the auxiliary opposite electrode 223a. For example, when viewed from a direction perpendicular to the top surface of the substrate 100 (or from a plan view, or a view perpendicular or normal with respect to a display surface), each of the opening portions BMLA of the bottom metal layer BML is located inside an edge of corresponding one among the openings 223aH of the auxiliary opposite electrode 223a.

In the above, the auxiliary opposite electrode 223a includes the overlapping portions 223aO and the connectors 223aC in the component area CA, the overlapping portions 223aO overlapping the auxiliary pixel electrodes 221a, and the connectors 223aC connecting the overlapping portions 223aO. The bottom metal layer BML, which is a shield layer, may also include main shield portions BMLO and connection shield portions BMLC, the main shield portions BMLO overlapping the auxiliary pixel electrode 221a, and the connection shield portions BMLC connecting the main shield portions BMLO. An orthogonal projection image of the contact metals CM' onto the bottom metal layer BML, which is the shield layer, is arranged inside the connection shield portions BMLC, the contact metals CM' being connection wirings that electrically connect the auxiliary pixel electrodes 221a to the auxiliary thin-film transistors TFTa. Specifically, when viewed from the direction perpendicular to the top surface of the substrate 100 (or from a plan view, or a view perpendicular or normal with respect to a display surface), the contact metals CM' are located inside the connection shield portions BMLC. Through this configuration, the contact metal CM', which is the connection wiring, may not be damaged by the laser beam during the manufacturing process.

Figure 8:
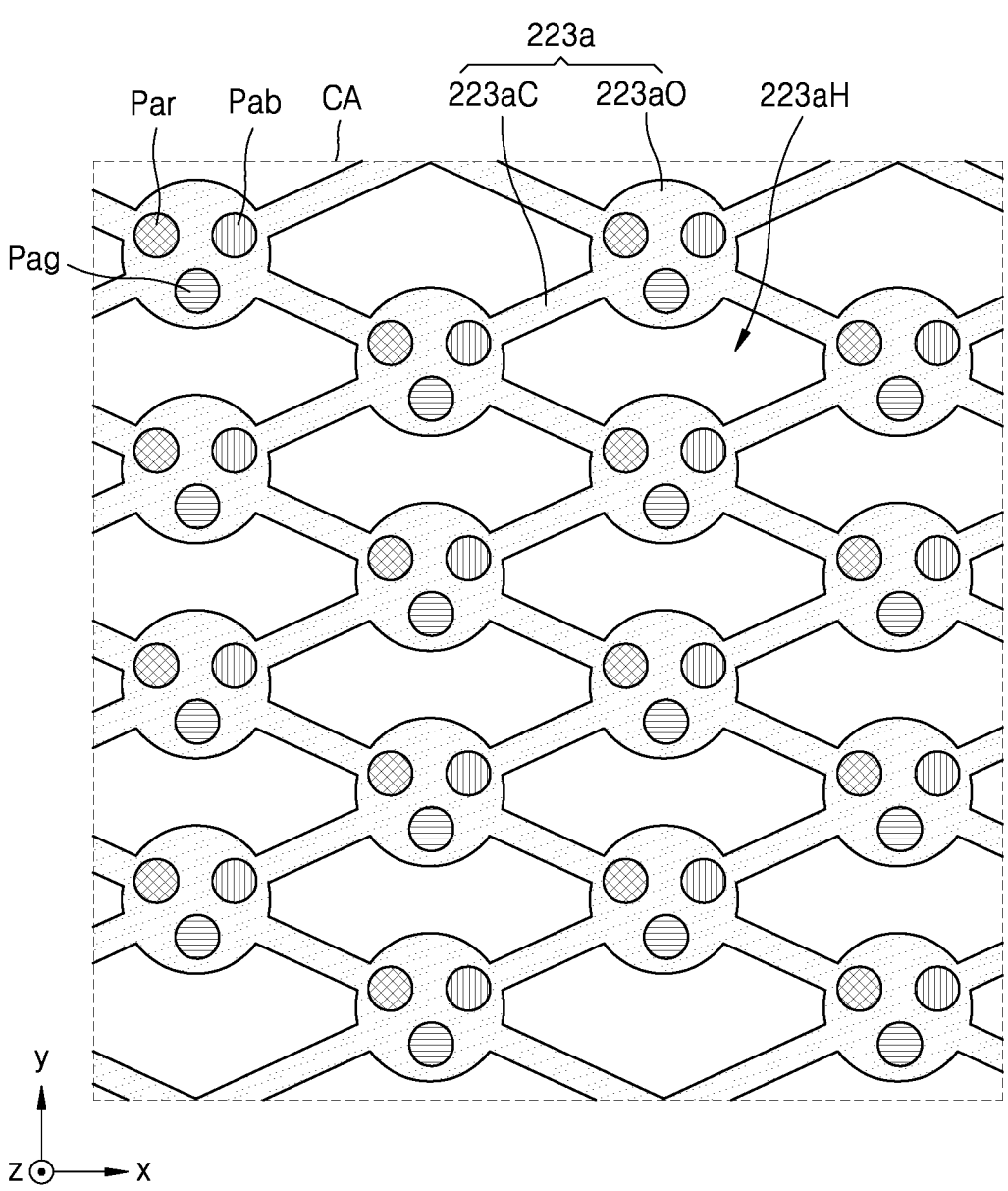
FIG. 8 is a plan view of a portion of a display apparatus according to some embodiments.
Figure 9:
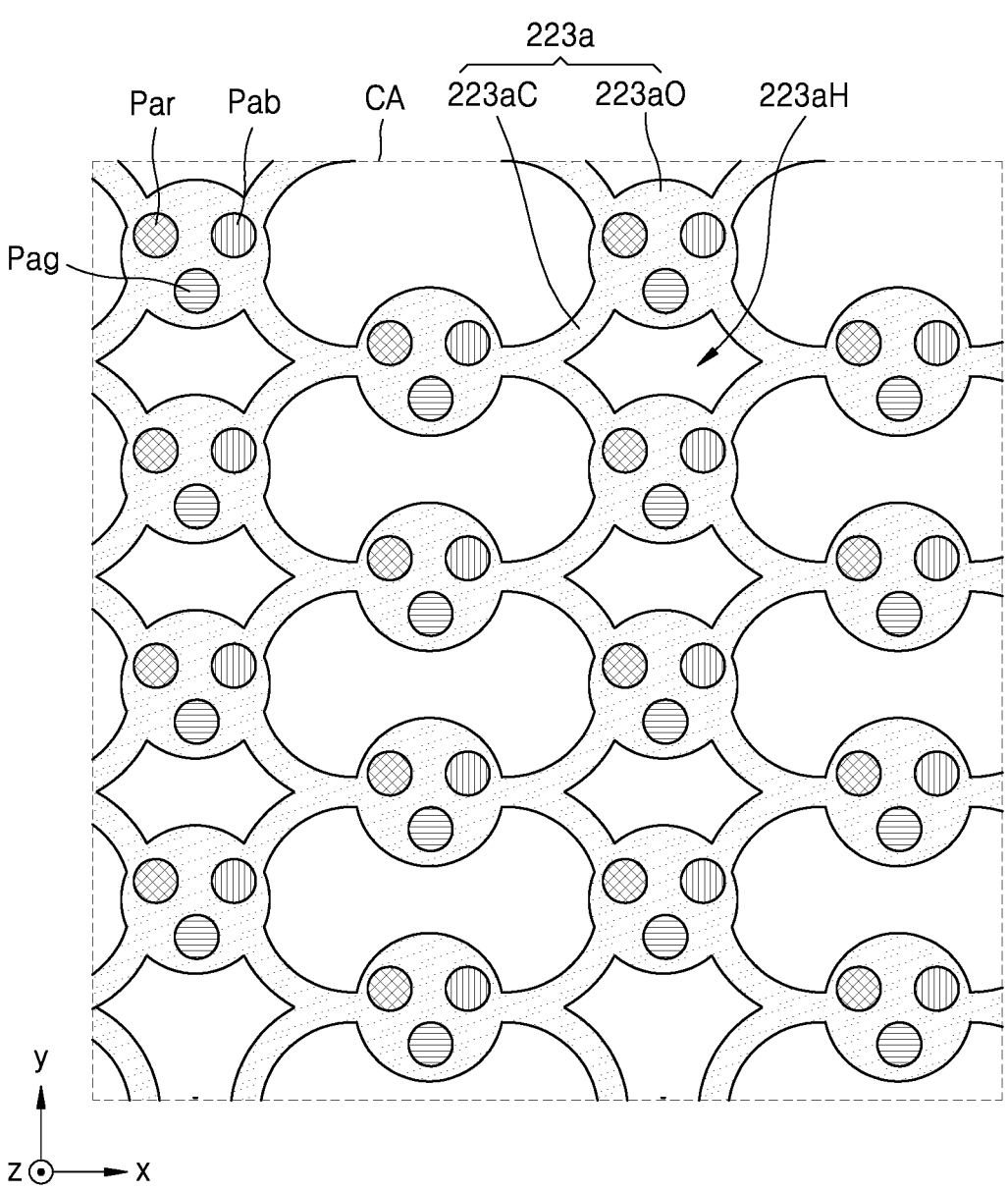
FIG. 9 is a plan view of a portion of a display apparatus according to some embodiments.

FIG. 8 is a plan view of a portion of the display apparatus 1 according to some embodiments. The display apparatus according to the present embodiments is different from the display apparatus according to the embodiments described with respect to FIG. 6 in that the overlapping portion 223aO of the auxiliary opposite electrode 223a approximately has a circular shape. The overlapping portion 223aO of the auxiliary opposite electrode 223a approximately has a circular shape, and thus, the occurrence of diffraction may be reduced when light progresses toward the component 40 from the outside of the display apparatus 1, or light from the component 40 passes through the transmission area of the component 40. As shown in FIG. 9, which is a plan view of a portion of the display apparatus 1 according to some embodiments, the connection portion 223aC of the auxiliary opposite electrode 223a may have a curved shape in a view in a direction perpendicular to the substrate 100, and thus, the occurrence of diffraction may be even more reduced when light progresses toward the component 40 from the outside of the display apparatus 1, or light from the component 40 passes through the transmission area of the component 40.

Figure 10:
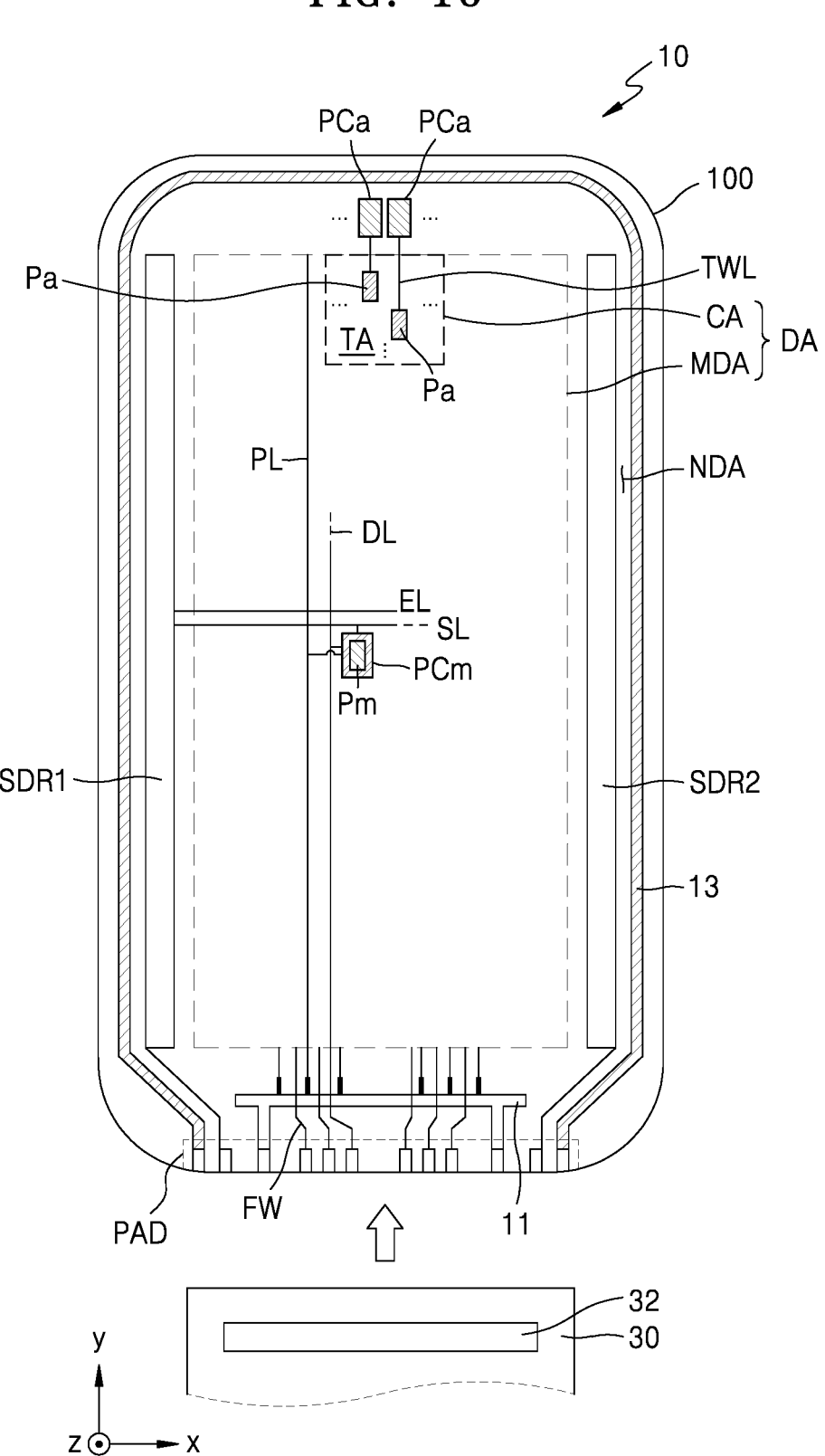
FIG. 10 is a plan view of a display panel that may be included in the display apparatus of FIG. 1A according to some embodiments.

Up to this point, description is made to the case where the auxiliary pixel circuit PCa electrically connected to the auxiliary sub-pixel Pa inside the component area CA is arranged in the component area CA, but the embodiments according to the present disclosure are not limited thereto. That is, as shown in FIG. 10, which is a plan view of the display panel 10 that may be included in the display apparatus 1 of FIG. 1A, the auxiliary pixel circuit PCa electrically connected to the auxiliary sub-pixel Pa inside the component area CA may be arranged in the peripheral area NDA. The auxiliary pixel circuit PCa may include the auxiliary thin-film transistor including the auxiliary semiconductor layer and the auxiliary gate electrode.

Even in this case, the plurality of main sub-pixels Pm are arranged in the main display area MDA. In addition, the main pixel circuit PCm that drives the main sub-pixel Pm may be arranged in the main display area MDA, and may overlap the main sub-pixel Pm. In addition, the auxiliary pixel circuit PCa that drives the plurality of auxiliary sub-pixels Pa in the component area CA may be arranged in the peripheral area NDA neighboring the component area CA. As shown in FIG. 3, in the case where the component area CA is arranged above ((+) y-direction) the display area DA, the auxiliary pixel circuit PCa may be arranged in the top peripheral area NDA. The auxiliary pixel circuit PCa may be connected to a display element that implements the auxiliary sub-pixel Pa by a connection wiring TWL extending in one direction (e.g. a y-direction). Though it is shown in FIG. 3 that the auxiliary pixel circuit PCa is arranged right above the component area CA, the embodiments are not limited thereto. As an example, the auxiliary pixel circuit PCa may be arranged on the left (in a (−) x-direction) or the right (in a (+) x-direction) of the main display area MDA. Various modifications may be made.

Figure 11A:
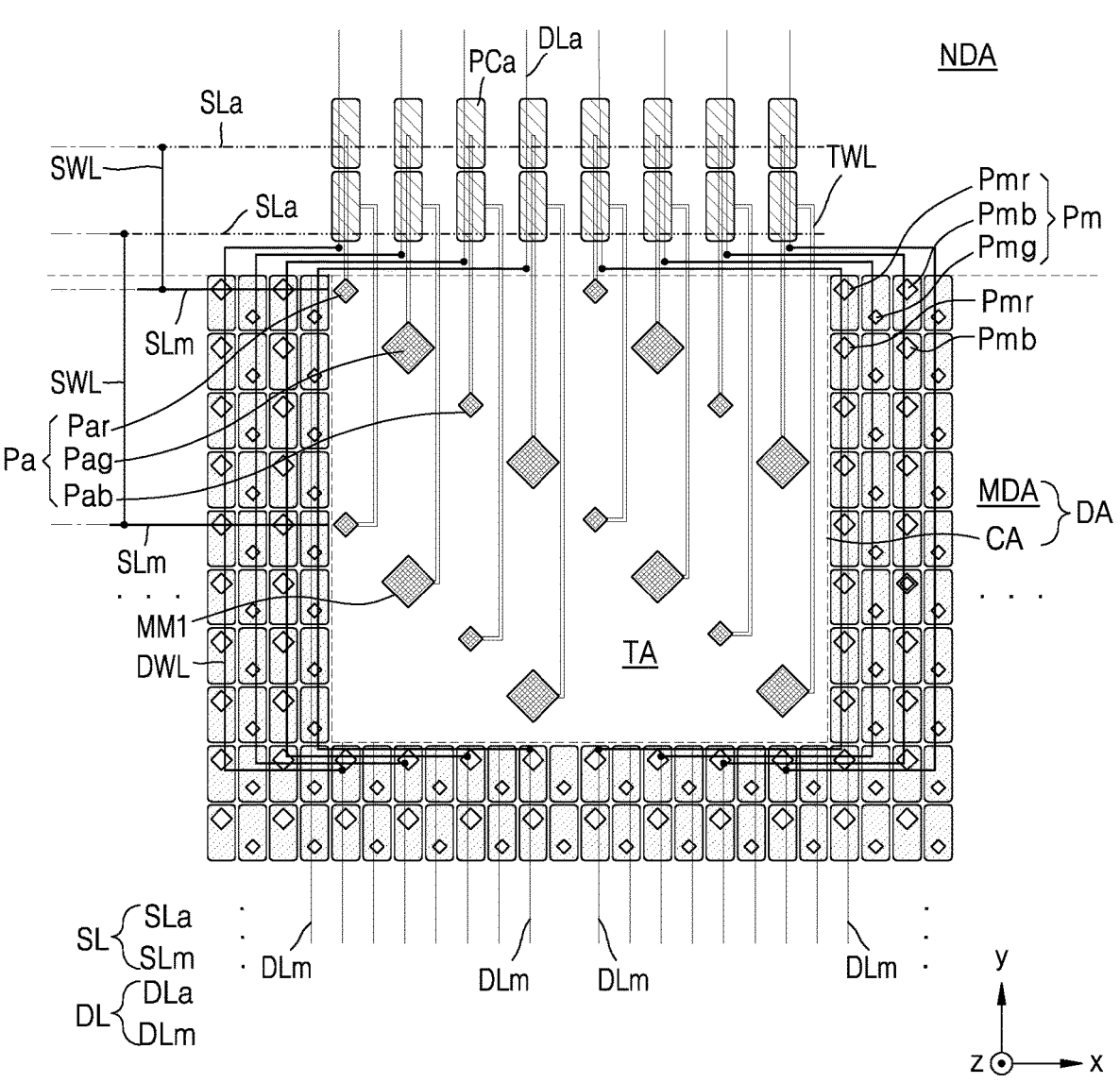
FIGS. 11A and 11B are plan arrangement views of a partial region of a display apparatus according to some embodiments.
Figure 11B:
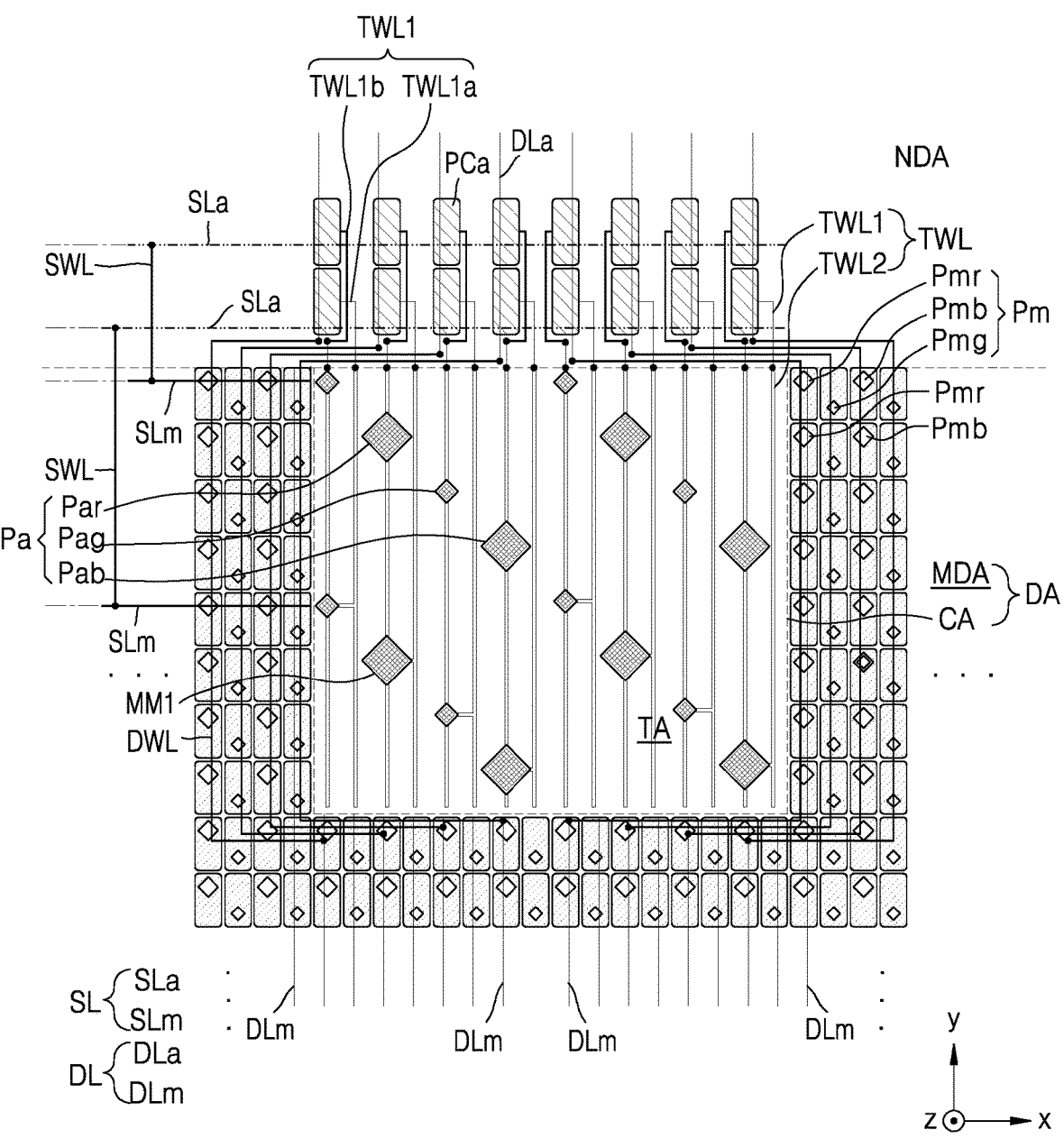

FIGS. 11A and 11B are plan arrangement views of a partial region of the display apparatus 1 according to some embodiments. According to some embodiments, FIGS. 11A and 11B show the component area CA, a portion of the main display area MDA, and the peripheral area NDA adjacent thereto.

Referring to FIG. 11A, the plurality of main sub-pixels Pm may be arranged in the main display area MDA. Here, a sub-pixel is a minimum unit that displays an image and denotes an emission area that emits light from a display element. In the case where an organic light-emitting diode is employed as a display element, the emission area may be defined by an opening of the pixel-defining layer. This is the same as described above. Each of the plurality of main sub-pixels Pm may emit red, green, blue, or white light.

The main sub-pixels Pm arranged in the main display area MDA may include a first sub-pixel Pmr, a second sub-pixel Pmg, and a third sub-pixel Pmb. The first sub-pixel Pmr, the second sub-pixel Pmg, and the third sub-pixel Pmb may respectively display red, green, and blue colors. The main sub-pixels Pm may be arranged in a pentile structure.

As an example, first sub-pixels Pmr are respectively arranged on first and third vertexes among the vertexes of a virtual quadrangle with a second sub-pixel Pmg centered at the center of the quadrangle, and third sub-pixels Pmb are respectively arranged on second and fourth vertexes, which are the rest of the vertexes. According to some embodiments, the size (that is, the emission area) of the second sub-pixel Pmg may be less than the size (that is, the emission area) of the first sub-pixel Pmr and the size (that is, the emission area) of the third sub-pixel Pmb.

This pixel arrangement structure is referred to as a Pen-Tile matrix structure or a PenTile structure. By applying rendering, in which a color of a pixel is represented by sharing the colors of its adjacent pixels, a high resolution may be obtained via a small number of pixels.

Though it is shown in FIG. 11A that the plurality of main sub-pixels Pm are arranged in a pentile matrix structure, the embodiments according to the present disclosure are not limited thereto. As an example, a plurality of main sub-pixels Pm may be arranged in various configurations such as a stripe structure, a mosaic arrangement structure, and a delta arrangement structure.

In the main display area MDA, the main pixel circuits PCm may overlap the main sub-pixels Pm and be arranged in a matrix configuration in the x-direction and the y-direction. In the present specification, the main pixel circuit PCm may denote a unit of a pixel circuit that implements one main sub-pixel Pm.

The plurality of auxiliary sub-pixels Pa may be arranged in the component area CA. Each of the plurality of auxiliary sub-pixels Pa may emit red, green, blue, or white light. The auxiliary sub-pixels Pa may include a first sub-pixel Par, a second sub-pixel Pag, and a third sub-pixel Pab respectively displaying different colors. The first sub-pixel Par, the second sub-pixel Pag, and the third sub-pixel Pab may respectively display red, green, and blue colors.

The number of auxiliary sub-pixels Pa per unit area in the component area CA may be less than the number of main sub-pixels Pm per unit area in the main display area MDA. As an example, the number of auxiliary sub-pixels Pa per same area and the number of main sub-pixels Pm per same area may be provided at ratios of 1:2, 1:4, 1:8, and 1:9. That is, the resolution of the component area CA may be about ½, ¼, ⅛, or ⅑ of the resolution of the main display area MDA. FIG. 11A shows the case where the resolution of the component area CA is about ⅛.

The auxiliary sub-pixels Pa arranged in the component area CA may be arranged in various configurations. Some of the auxiliary sub-pixels Pa may gather to constitute a pixel group and be arranged in various configurations in the pixel group such as a pentile structure, a stripe structure, a mosaic arrangement structure, and a delta arrangement structure. In this case, a distance between the auxiliary sub-pixels Pa arranged in the pixel group and a distance between the main sub-pixels Pm may be same.

Alternatively, as shown in FIG. 11A, the auxiliary sub-pixels Pa may be dispersed in the component area CA. That is, a distance between the auxiliary sub-pixels Pa may be greater than a distance between the main sub-pixels Pm. A region of the component area CA in which the auxiliary sub-pixels Pa are not arranged may be the transmission area TA having a relatively high light transmittance.

The auxiliary pixel circuits PCa that implement light-emission of the auxiliary pixels Pa may be arranged in the peripheral area NDA. The auxiliary pixel circuits PCa are not arranged in the component area CA, and thus, the component area CA may secure a relatively wider transmission area TA.

The auxiliary pixel circuits PCa may be connected to the auxiliary sub-pixels Pa by the connection wirings TWL. Accordingly, in the case where the length of the connection wiring TWL increases, an RC delay may occur, and thus, the auxiliary pixel circuits PCa may be arranged by taking into account the length of the connection wirings TWL.

According to some embodiments, the auxiliary pixel circuits PCa may be arranged on an extension line connecting the auxiliary sub-pixels Pa arranged in the y-direction. In addition, the auxiliary pixel circuits PCa may be arranged in the y-direction by the number of auxiliary sub-pixels Pa arranged in the y-direction. As an example, in the case where two auxiliary sub-pixels Pa are arranged in the y-direction in the component area CA as shown in FIG. 11A, two auxiliary pixel circuits PCa may be arranged in the y-direction in the peripheral area NDA.

The connection wirings TWL may extend in the y-direction to connect the auxiliary sub-pixels Pa to the auxiliary pixel circuits PCa. When the connection wiring TWL is connected to the auxiliary sub-pixel Pa, it may denote that the connection wiring TWL is electrically connected to a pixel electrode of a display element that implements the auxiliary sub-pixel Pa.

The scan line SL may include a main scan line SLm and an auxiliary scan line SLa, the main scan line SLm being connected to the main pixel circuit PCm, and the auxiliary scan line SLa being connected to the auxiliary pixel circuit PCa. The main scan line SLm may extend in the x-direction and be connected to the main pixel circuits PCm arranged on the same row. The main scan line SLm may not be arranged in the component area CA. That is, the main scan line SLm may be disconnected with the component area CA therebetween. In this case, the main scan line SLm on the left of the component area CA may receive a signal from the first scan driving circuit SDR1 (see FIG. 3), and the main scan line SLm on the right of the component area CA may receive a signal from the second scan driving circuit SDR2 (see FIG. 3).

The auxiliary scan line SLa may extend in the x-direction and be connected to the auxiliary pixel circuits PCa. The auxiliary scan line SLa may be arranged in the peripheral area NDA.

The main scan line SLm may be connected to the auxiliary scan line SLa by a scan connection line SWL, and thus, the same signal may be applied to pixel circuits that drive the main sub-pixel Pm and the auxiliary sub-pixel Pa arranged on the same row. The scan connection line SWL may be arranged on a layer different from the main scan line SLm and the auxiliary scan line SLa, and connected to the main scan line SLm and the auxiliary scan line SLa through contact holes. The scan connection line SWL may be arranged in the peripheral area NDA.

The data line DL may include a main data line DLm and an auxiliary data line DLa, the main data line DLm being connected to the main pixel circuits PCm, and the auxiliary data line DLa being connected to the auxiliary pixel circuits PCa. The main data line DLm may extend in the y-direction and be connected to the main pixel circuits PCm arranged on the same column. The auxiliary data line DLa may extend in the y-direction and be connected to the auxiliary pixel circuits PCa arranged on the same column.

The main data line DLm may be apart from the auxiliary data line DLa with the component area CA therebetween. The main data line DLm may be connected to the auxiliary data line DLa by a data connection line DWL, and thus, the same signal may be applied to pixel circuits that drive the main sub-pixel Pm and the auxiliary sub-pixel Pa arranged on the same column.

The data connection line DWL may detour the component area CA. According to some embodiments, the data connection line DWL may overlap the main pixel circuits PCm arranged in the main display area MDA. The data connection line DWL is arranged in the main display area MDA, and thus, a separate space in which the data connection line DWL is arranged does not need to be secured. Accordingly, the area of a dead space may be minimized.

According to some embodiments, the data connection line DWL may be arranged in an intermediate area between the main display area MDA and the component area CA.

The data connection line DWL may be arranged on a layer different from the main data line DLm and the auxiliary data line DLa, and connected to the main data line DLm and the auxiliary data line DLa through contact holes.

Figure 12:
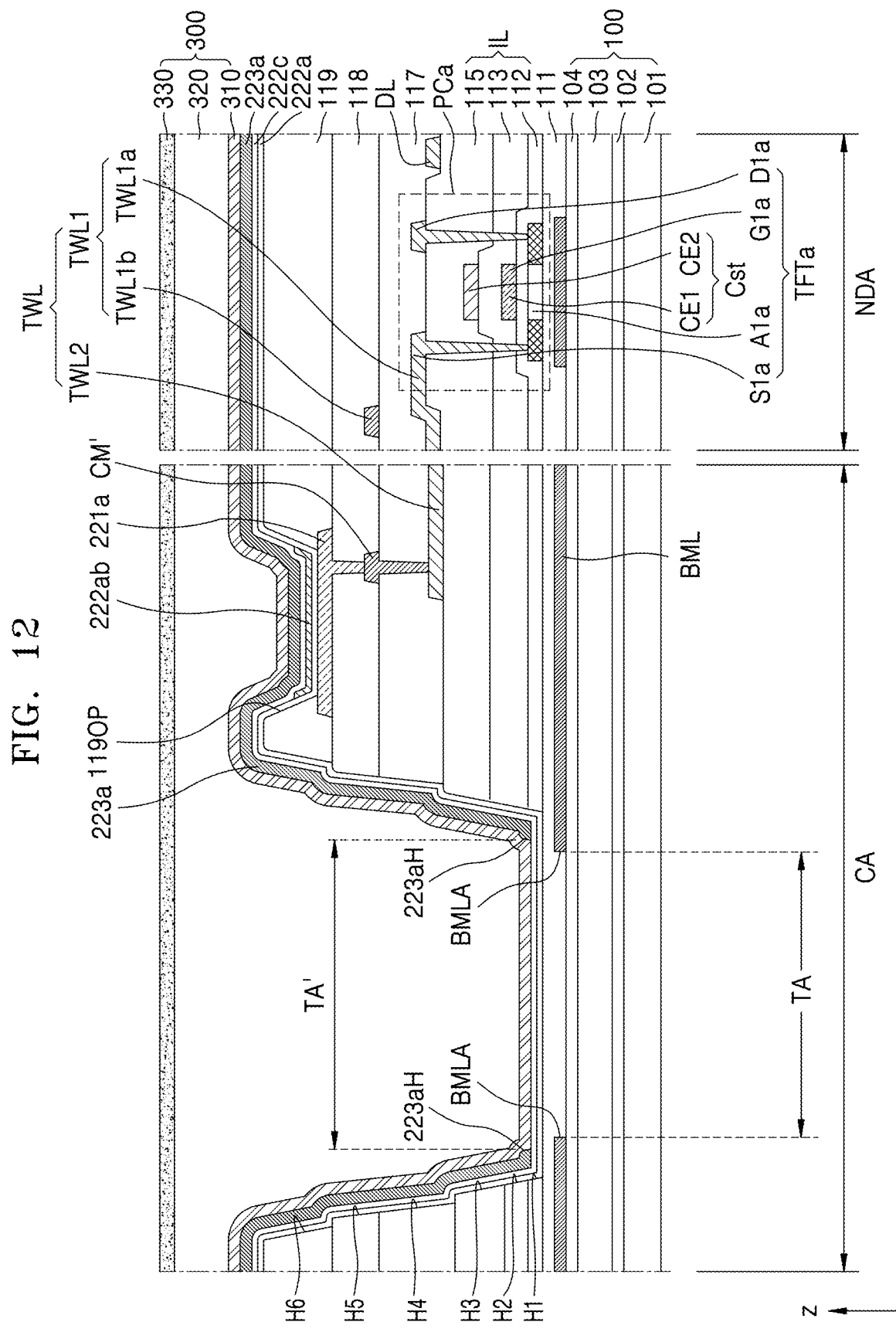
FIG. 12 is a cross-sectional view of a portion of FIG. 11B according to some embodiments.

Though it is shown in FIG. 11A that the connection wiring TWL is provided as one body over the auxiliary sub-pixels Pa from the peripheral area NDA to the component area CA, the embodiments according to the present disclosure are not limited thereto. As an example, as shown in FIG. 11B and FIG. 12, which is a cross-sectional view of a portion of FIG. 11B, the connection wiring TWL may include a first connection wiring TWL1 and a second connection wiring TWL2 including different materials.

The first connection wiring TWL1 may be a wiring arranged in the peripheral area NDA and connected to the auxiliary pixel circuit PCa. The first connection wiring TWL1 may include a conductive material including molybdenum (Mo), aluminum (Al), copper (Cu), and titanium (Ti) and have a single-layered or multi-layered structure including the above materials. The first connection wiring TWL1 may be provided in a plurality between the auxiliary pixel circuits PCa. According to some embodiments, the first connection wiring TWL1 may include a (1-1)st connection wiring TWL1a and a (1-2)nd connection wiring TWL1b arranged on different layers. As an example, the (1-1)st connection wiring TWL1a and the data line DL may be located on a same layer and may include the same material (see FIG. 12). The (1-2)nd connection wiring TWL1b may be apart from the (1-1)st connection wiring TWL1a with an insulating layer therebetween (see FIG. 12). The (1-1)st connection wiring TWL1a and the (1-2)nd connection wiring TWL1b may be arranged between the auxiliary pixel circuits PCa and at least partially curved in a plan view. The (1-1)st connection wiring TWL1a and the (1-2)nd connection wiring TWL1b arranged on different layers may be provided in a plurality and alternately arranged in a region between the plurality of pixel circuits PCa.

The second connection wiring TWL2 may be a wiring arranged in the component area CA and connected between the first connection wiring TWL1 and the edge of the component area CA. The second connection wiring TWL2 may include a transparent conductive material.

The first connection wiring TWL1 and the second connection wiring TWL2 may be located on the same layer or different layers. In the case where the first connection wiring TWL1 and the second connection wiring TWL2 are arranged on different layers, the first connection wiring TWL1 may be connected to the second connection wiring TWL2 through a contact hole.

The conductivity of the first connection wiring TWL1 may be higher than the conductivity of the second connection wiring TWL2. The first connection wiring TWL1 is arranged in the peripheral area NDA, and thus, does not need to secure a light transmittance. Accordingly, the first connection wiring TWL1 may employ a material having a low light transmittance and a high conductivity. Accordingly, a resistance value of the connection wiring TWL may be reduced.

In addition, as shown in FIG. 11B, the lengths of the plurality of second connection wirings TWL2 may be the same. As an example, the ends of the plurality of second connection wirings TWL2 may extend to the boundary of the component area CA on the opposite side in which the auxiliary pixel circuits PCa are arranged. This is to match the electric load due to the second connection wiring TWL2. Accordingly, a brightness deviation in the component area CA may be reduced. The number of second connection wirings TWL2 in the component area CA and the number of auxiliary pixel circuits PCa may be same.

As shown in FIGS. 11A and 11B, wirings in the component area CA, for example, the connection wirings TWL may overlap the bottom metal layer BML, which is the shield layer, in a view in a direction perpendicular to the substrate 100. As an example, in the case where the bottom metal layer BML includes main shield portions BMLO and connection shield portions BMLC, the main shield portions BMLO overlapping the auxiliary pixel electrodes 221*a*, and the connection shield portions BMLC connecting the main shield portions BMLO, the connection wirings TWL may overlap the connection shield portions BMLC. An orthogonal projection image of the connection wirings TWL onto the bottom metal layer BML, which is the shield layer, is arranged inside the connection shield portions BMLC. Specifically, when viewed from the direction perpendicular to the top surface of the substrate 100 (or from a plan view, or a view perpendicular or normal with respect to a display surface), the connection wirings TWL are located inside the connection shield portions BMLC. In this case, the connection wirings TWL may also overlap the connection portions 223*a*C of the auxiliary opposite electrode 223*a*. Through this configuration, the connection wirings TWL may not be damaged by the laser beam during the manufacturing process.

Figure 13:
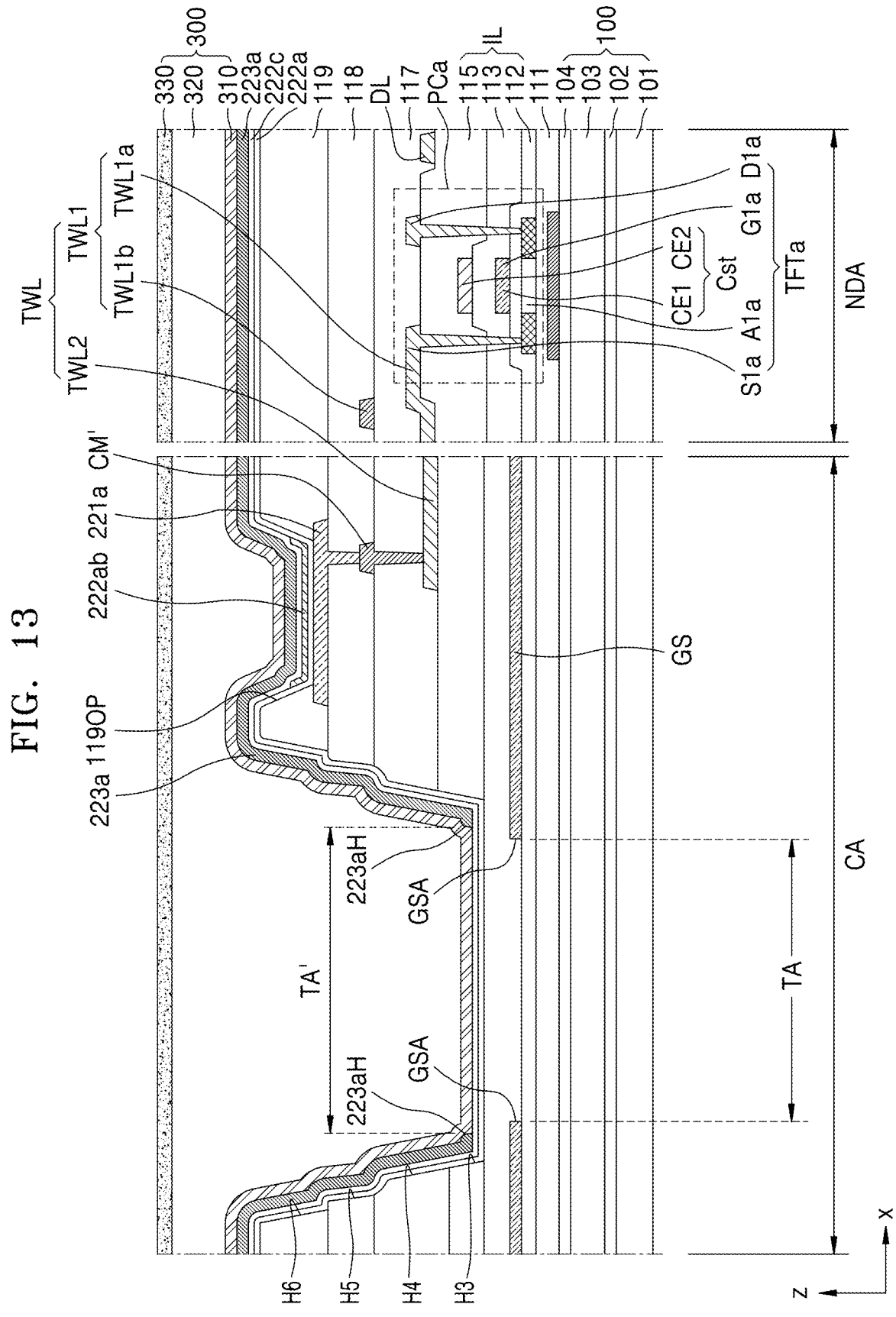
FIG. 13 is a cross-sectional view of a portion of a display apparatus according to some embodiments.

Up to this point, though description is made to the case where the bottom metal layer BML serves as the shield layer, the embodiments according to the present disclosure are not limited thereto. As an example, as shown in FIG. 13, which is a cross-sectional view of a portion of the display apparatus 1 according to some embodiments, a shield layer GS and an auxiliary gate electrode G1*a* of the auxiliary thin-film transistor TFTa may be located on a same layer. According to some embodiments, the shield layer GS and the main gate electrode G1 of the main thin-film transistor TFTm in the main display area MDA may be located on a same layer. This is because each of elements of the auxiliary thin-film transistor TFTa arranged in the peripheral area NDA and a corresponding element of the main thin-film transistor TFTm arranged in the main display area MDA may be located on the same layer and may include the same material. Accordingly, the shield layer GS, the auxiliary gate electrode G1*a* of the auxiliary thin-film transistor TFTa, and the main gate electrode G1 of the main thin-film transistor TFTm may include the same material and have the same layer structure.

The shield layer GS may include a plurality of opening portions GSA defining the transmission area TA in the component area CA. All descriptions of the opening portion BMLA of the bottom metal layer BML are applicable to the opening portion GSA of the shield layer GS. However, as shown in FIG. 13, the gate insulating layer 112 and the first interlayer insulating layer 113 do not include a hole, the second interlayer insulating layer 115, the first planarization layer 117, the second planarization layer 118, and the pixel-defining layer 119 may be each arranged in the transmission area TA and may respectively include the third hole H3, the fourth hole H4, the fifth hole H5, and the sixth hole H6. In this case, the first functional layer 222*a* may be arranged on the first interlayer insulating layer 113 in the transmission area TA.

Alternatively, the display apparatus may include a wiring arranged between the auxiliary gate electrode G1*a* and the auxiliary pixel electrode 221*a* and/or between the main gate electrode and the main pixel electrode, and the shield layer and the wiring may include the same material and be located on the same layer. In this case, the first functional layer 222*a* may be arranged on a layer covering the wiring.

According to some embodiments, a display apparatus in which an image may be displayed even in a component area and which is easily manufactured may be implemented.

However, the scope of embodiments according to the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate including a main display area, a component area, and a peripheral area, the component area having a transmission area;
a plurality of main pixel electrodes in the main display area of the substrate;
a plurality of auxiliary pixel electrodes in the component area of the substrate;
an auxiliary opposite electrode over the auxiliary pixel electrodes, overlapping the auxiliary pixel electrodes, and including a plurality of openings between the auxiliary pixel electrodes; and
a shield layer below the plurality of auxiliary pixel electrodes, formed as a single body to correspond to the plurality of auxiliary pixel electrodes, and including a plurality of opening portions that define boundaries of the transmission area
and overlap the plurality of openings of the auxiliary opposite electrode,
wherein the single body of the shield layer extends from the transmission area to the main display area, and
wherein, in a plan view, the single body of the shield layer has a mesh shape in a first direction and a second direction crossing the first direction, in the component area.

2. The display apparatus of claim 1, further comprising:
a component below the substrate to correspond to the component area.

3. The display apparatus of claim 1, further comprising:
a main opposite electrode over the main pixel electrodes and overlapping the main pixel electrodes.

4. The display apparatus of claim 3, wherein the main opposite electrode is connected to the auxiliary opposite electrode.

5. The display apparatus of claim 1, wherein the auxiliary opposite electrode includes a plurality of overlapping portions and connectors, the overlapping portions overlapping the auxiliary pixel electrodes, and the connectors connecting the overlapping portions.

6. The display apparatus of claim 5, wherein the connectors have a curved shape in the plan view.

7. The display apparatus of claim 1, wherein a melting point of the shield layer is higher than a melting point of the auxiliary opposite electrode.

8. The display apparatus of claim 1, wherein an area of the shield layer is equal to or greater than an area of the auxiliary opposite electrode.

9. The display apparatus of claim 1, wherein, in the plan view, each of the opening portions is inside an edge of a corresponding one among the openings.

10. The display apparatus of claim 1, further comprising:
main thin-film transistors in the main display area of the substrate, electrically connected to the main pixel electrodes, and including a main semiconductor layer and a main gate electrode,
wherein the shield layer and the main gate electrode are on a same layer.

11. The display apparatus of claim 10, wherein the shield layer and the main gate electrode include a same material.

12. The display apparatus of claim 1, further comprising:
main thin-film transistors in the main display area of the substrate, electrically connected to the main pixel electrodes, and including a main semiconductor layer and a main gate electrode; and
a wiring between the main gate electrode and the main pixel electrodes,
wherein the shield layer and the wiring are on a same layer.

13. The display apparatus of claim 12, wherein the shield layer and the wiring include a same material.

14. The display apparatus of claim 1, further comprising:
main thin-film transistors in the main display area of the substrate, electrically connected to the main pixel electrodes, and including a main semiconductor layer and a main gate electrode; and
a bottom metal layer below the main semiconductor layer,
wherein the shield layer and the bottom metal layer are on a same layer.

15. The display apparatus of claim 14, wherein the shield layer and the bottom metal layer include a same material.

16. The display apparatus of claim 1, further comprising:
main thin-film transistors in the main display area of the substrate, electrically connected to the main pixel electrodes, and including a main semiconductor layer and a main gate electrode;

auxiliary thin-film transistors in the peripheral area of the substrate and including an auxiliary semiconductor layer and an auxiliary gate electrode; and
connection wirings electrically connecting the auxiliary thin-film transistors to the auxiliary pixel electrodes.

17. The display apparatus of claim 16, wherein the auxiliary opposite electrode includes a plurality of overlapping portions and connectors, the overlapping portions overlapping the auxiliary pixel electrodes, and the connectors connecting the overlapping portions, and
the connectors overlap the connection wirings.

18. The display apparatus of claim 17, wherein the shield layer includes main shield portions and connection shield portions, the main shield portions overlapping the auxiliary pixel electrodes, and the connection shield portions connecting the main shield portions, and,
in the component area, in the plan view, the connection wirings are arranged in the connection shield portions.

19. The display apparatus of claim 1, further comprising:
main thin-film transistors in the main display area of the substrate, electrically connected to the main pixel electrodes, and including a main semiconductor layer and a main gate electrode; and
auxiliary thin-film transistors in the component area of the substrate, electrically connected to the auxiliary pixel electrodes, and including an auxiliary semiconductor layer and an auxiliary gate electrode,
wherein the shield layer is below the auxiliary semiconductor layer.

20. The display apparatus of claim 19, wherein the shield layer overlaps the auxiliary semiconductor layer and the auxiliary gate electrode.

21. The display apparatus of claim 19, further comprising:
an auxiliary wiring in the component area of the substrate and connected to the auxiliary semiconductor layer,
wherein the shied layer overlaps the auxiliary wiring.

* * * * *